US012581866B2

(12) United States Patent
Xu et al.

(10) Patent No.: US 12,581,866 B2
(45) Date of Patent: Mar. 17, 2026

(54) MEMORY DEVICE AND METHOD FOR FABRICATING THE SAME

(71) Applicant: Taiwan Semiconductor Manufacturing Company, Ltd., Hsinchu (TW)

(72) Inventors: Nuo Xu, San Jose, CA (US); Yuan Hao Chang, Hsinchu County (TW); Po-Sheng Lu, Hsinchu (TW); Zhiqiang Wu, Chubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 481 days.

(21) Appl. No.: 17/591,141

(22) Filed: Feb. 2, 2022

(65) Prior Publication Data

US 2023/0123764 A1 Apr. 20, 2023

Related U.S. Application Data

(60) Provisional application No. 63/255,564, filed on Oct. 14, 2021.

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
(Continued)

(56) References Cited

U.S. PATENT DOCUMENTS

2007/0097732 A1* 5/2007 Chung ................ G11C 11/1675
365/158
2008/0122047 A1* 5/2008 Honer ................... H01L 23/552
257/659

(Continued)

OTHER PUBLICATIONS

Bhushan et al. "Enhancing Magnetic Immunity of STT-MRAM with Magnetic Shielding" 2018 IEEE International Memory Workshop (IMW), published on Jun. 21, 2018.

*Primary Examiner* — Mounir S Amer
*Assistant Examiner* — Nicholas B Michaud
(74) *Attorney, Agent, or Firm* — Eschweiler & Potashnik, LLC

(57) ABSTRACT

An MRAM cell block and a magnetic shielding structure for the MRAM cell block are incorporated into a metal interconnect of an integrated circuit (IC) device. The magnetic shielding structure may be provided by metallization layers and via layers having wires and vias that incorporate a magnetic shielding material. The magnetic shielding material may form the wires and vias, form a liner around the wires, or may be a layer of the wires. The wires and vias may also include a metal that is more conductive than the magnetic shielding material. The metal interconnect may include layers above or below the magnetic shielding structure that lack the magnetic shielding material and are more conductive. The MRAM cell block with the magnetic shielding structure is optionally provided as a standalone memory device or incorporated into a 3-D IC device that includes a second substrate having a conventional metal interconnect.

20 Claims, 17 Drawing Sheets

(58) Field of Classification Search
USPC ......................................................... 257/422
See application file for complete search history.

(56)                    References Cited

U.S. PATENT DOCUMENTS

| | | | | |
|---|---|---|---|---|
| 2011/0241142 | A1* | 10/2011 | Matsubara | .............. H10B 61/22 |
| | | | | 257/422 |
| 2014/0225208 | A1* | 8/2014 | Gu | ......................... H10B 61/22 |
| | | | | 257/422 |
| 2016/0104638 | A1* | 4/2016 | Preusse | ............. H01L 21/76873 |
| | | | | 257/751 |
| 2016/0268499 | A1* | 9/2016 | You | ......................... H10N 50/01 |
| 2016/0351792 | A1* | 12/2016 | Jiang | ...................... H10B 61/20 |
| 2016/0359100 | A1 | 12/2016 | Bhushan et al. | |
| 2017/0025601 | A1 | 1/2017 | Bhushan et al. | |
| 2018/0158749 | A1* | 6/2018 | Yu | ........................... H01L 24/94 |
| 2019/0221477 | A1* | 7/2019 | Amanapu | ......... H01L 21/76858 |
| 2023/0031478 | A1* | 2/2023 | Wu | ........................ H10N 50/80 |
| 2023/0178496 | A1* | 6/2023 | Ji | ........................ H01L 23/3121 |
| | | | | 257/659 |

* cited by examiner

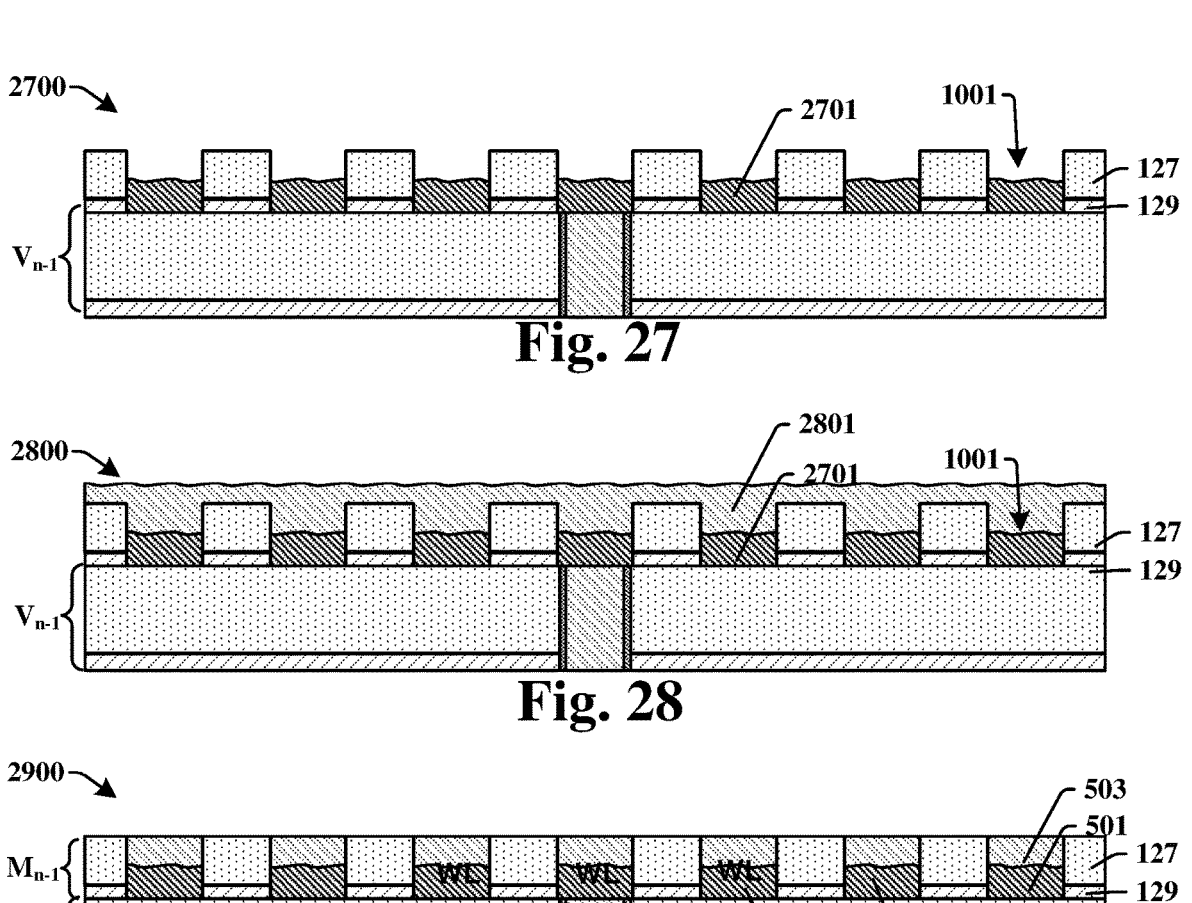
Fig. 27
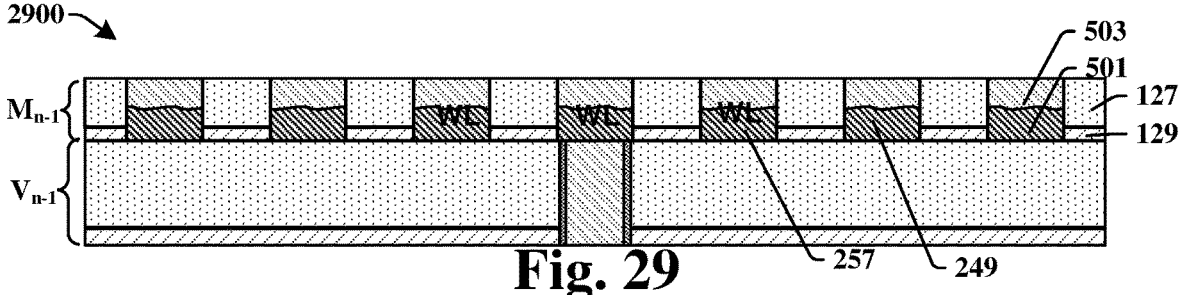
Fig. 28
Fig. 29
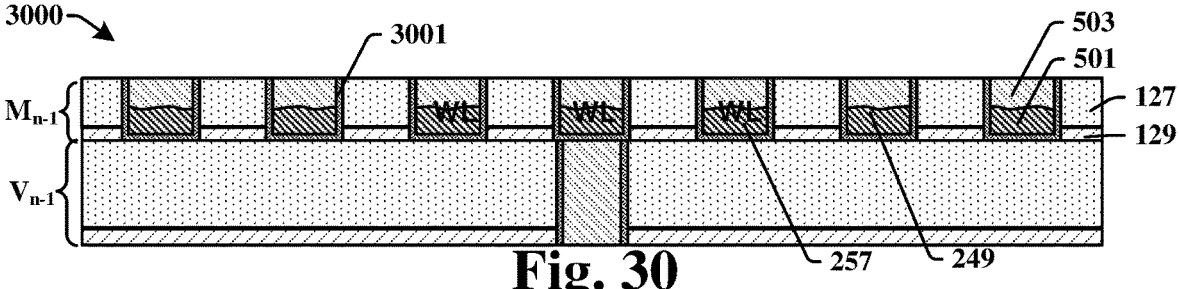
Fig. 30
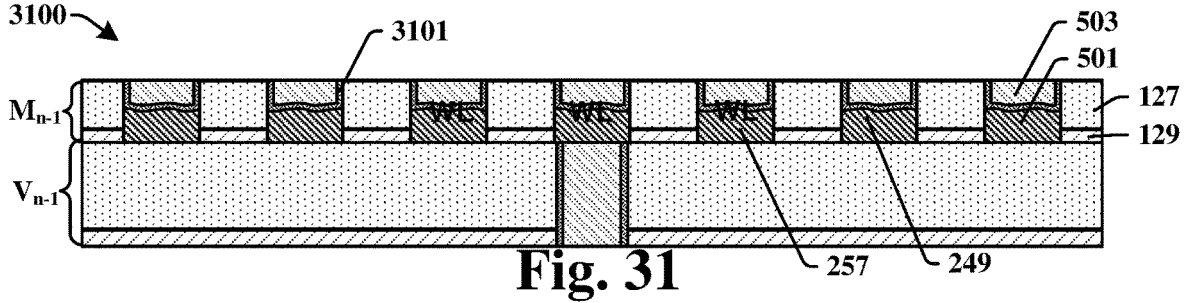
Fig. 31

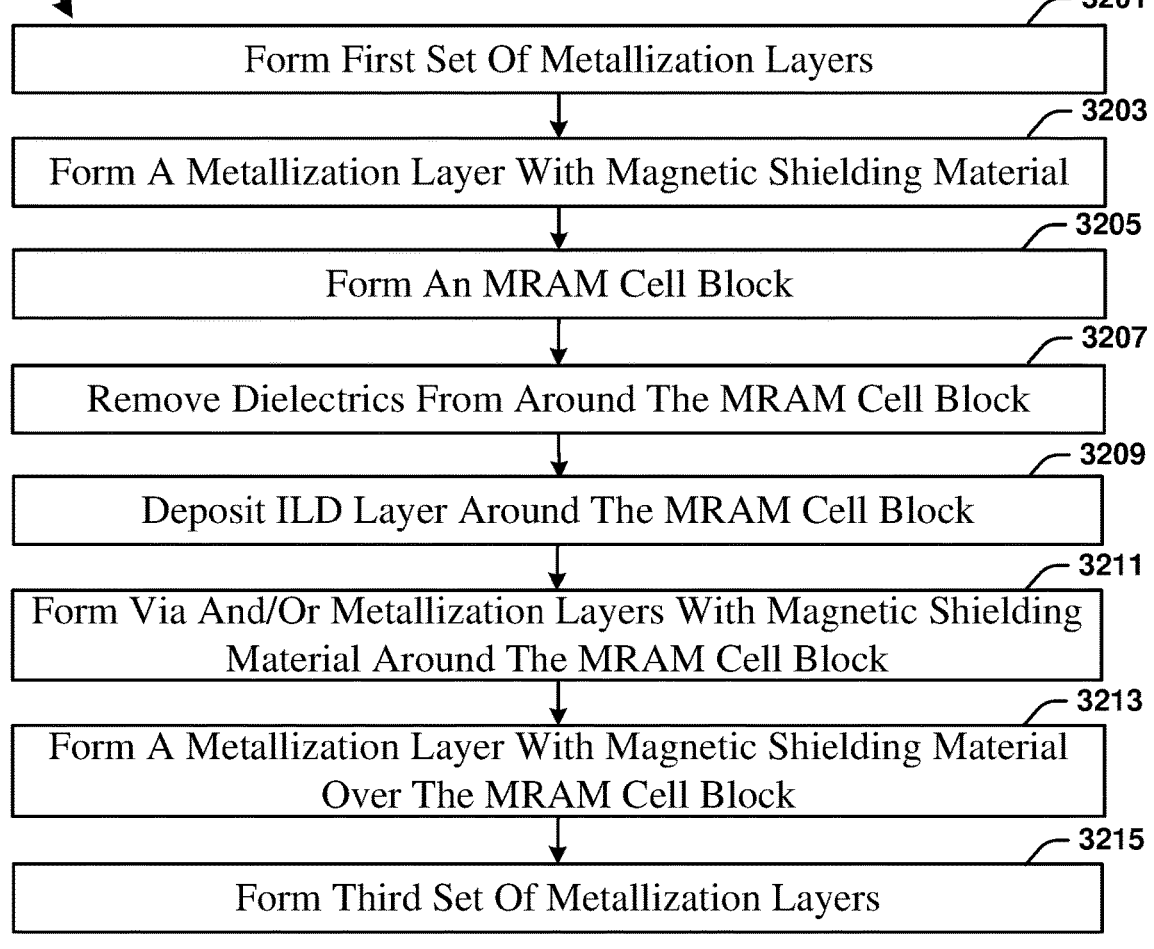

3200

3201
Form First Set Of Metallization Layers

3203
Form A Metallization Layer With Magnetic Shielding Material

3205
Form An MRAM Cell Block

3207
Remove Dielectrics From Around The MRAM Cell Block

3209
Deposit ILD Layer Around The MRAM Cell Block

3211
Form Via And/Or Metallization Layers With Magnetic Shielding Material Around The MRAM Cell Block 3213
Form A Metallization Layer With Magnetic Shielding Material Over The MRAM Cell Block 3215
Form Third Set Of Metallization Layers

Fig. 32

MEMORY DEVICE AND METHOD FOR FABRICATING THE SAME

REFERENCE TO RELATED APPLICATION

This application claims the benefit of U.S. Provisional Application No. 63/255,564, filed on Oct. 14, 2021, the contents of which are incorporated herein by reference in their entirety.

BACKGROUND

Semiconductor memories are used in integrated circuits for electronic applications such as radios, televisions, cell phones, and personal computing devices. One type of semiconductor memory is Magnetoresistive Random Access Memory (MRAM). An MRAM cell may include a Magnetic Tunnel Junction (MTJ), which includes a pinned layer, a free layer, and a tunneling barrier layer between the pinned layer and the free layer. A magnetic moment of the free layer may be varied relative to that of the pinned layer to switch the MTJ between a high resistance state and a low resistance state. The resistance states may be detected and used to represent either a logic zero or one. MRAM is non-volatile, has low power requirements, has fast switching speed, and has long retention time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25-31 illustrate variations on the method of FIGS. 9-24 in accordance with some other aspect of the present disclosure FIG. 32 provides a flow chart illustrating a method according to the present disclosure of forming an integrated circuit device that include a magnetic shielding structure according to the present disclosure around an MRAM cell block.

DETAILED DESCRIPTION

Figure 1:
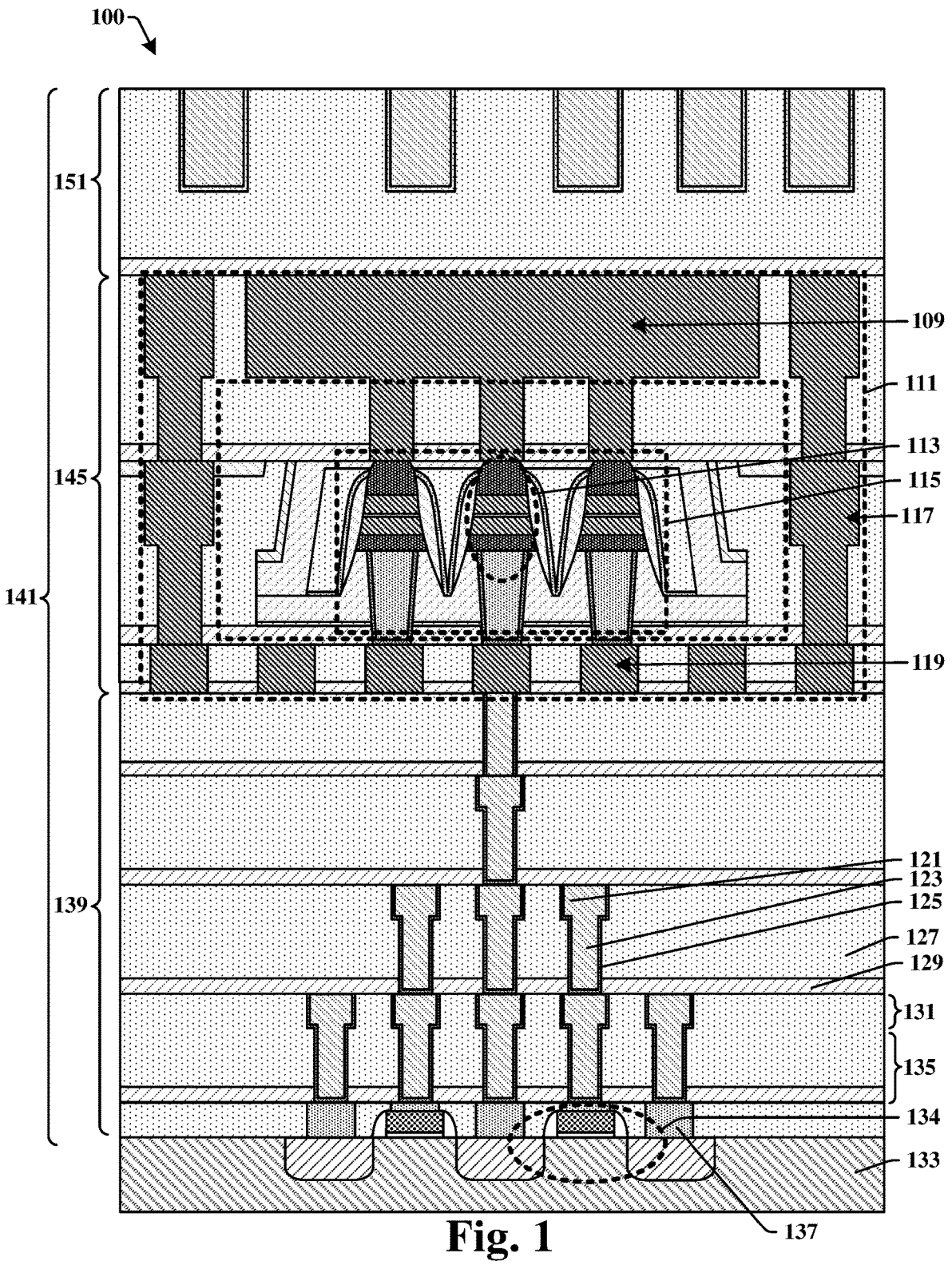
FIG. 1 illustrates a cross-sectional side view of an IC device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

If unshielded, MRAM may be disturbed by externally generated magnet fields such as those produced by magnets, power lines, and electronic devices. Shielding may be provided at the package level, however, such shielding increases packaging costs and the total thickness of the MRAM package. The greater thickness may be difficult to accommodate in small form factor electronic devices such as smart phones and watches.

According to the present disclosure, a magnetic shielding structure is incorporated into a metal interconnect within which the MRAM is disposed. In some embodiments, magnetic shielding structures are formed around each MRAM cell block in an MRAM that includes a plurality of MRAM cell blocks. In some embodiments, the metal interconnect comprises metallization layers and via layers in which the wires and vias have a composition that includes a magnetic shielding material that provides the magnetic shielding structure.

In some embodiments, the magnetic shielding material forms the wires. In some embodiments, the wires include a layer of the magnetic shielding material and a layer of a second metal that is more conductive than the magnetic shielding material. In some embodiments, the magnetic shielding material forms a liner around the second metal. In some embodiments, the magnetic shielding material is at the core of the wires.

In some embodiments, the magnetic shielding structure comprises portions above, below, and around an MRAM cell block. In some embodiments, the magnetic shielding structure include wires or vias that are operative as electrical connections within the metal interconnect. In some embodiments, the magnetic shielding structure comprises bit lines for the MRAM cell block. In some embodiments, the magnetic shielding structure comprises word lines for the MRAM cell block. For example, a portion of the magnetic shielding structure above the MRAM cell block may comprise the bit lines and a portion of the magnetic shielding structure below the MRAM cell block may comprise the word lines. In some embodiments, the magnetic shielding structure comprises wires or vias that are inoperative as electrical connections within the metal interconnect. In some embodiments, those inoperative wires or vias form structures that are floating within the metal interconnect. In some embodiments, those inoperative wires or vias form structures that dangle from operative wires or vias within the metal interconnect. In some embodiments, the inoperative wires or vias are coupled to ground.

In some embodiments, the magnetic shielding structure extends through a plurality of metallization layers of the metal interconnect. In some embodiments, the magnetic shielding includes an upper portion in a metallization layer above the MRAM cell block, a lower portion in a metallization layer below the MRAM cell block, and side portion in a via layer on a level with the MRAM cell block. In some embodiments, the side portion includes a fence of vias extending around the MRAM cell block. In some embodiments, a diameter of the vias in the fence is 50% or more a pitch of the vias in the fence. The side portion may therefore occupy 50% or more an area of a surface surrounding the sides of the MRAM cell block. The vias may be connected by wires, whereby the side portion forms a continuous structure surrounding the MRAM cell block. In some embodiments, the side portion include two rows of vias. Increasing the thickness or density of the side portion may be an area-efficient way of increasing the magnetic shielding efficiency of the magnetic shielding structure.

In some embodiments, each MRAM cell block includes 1000 or fewer cells. In some embodiments, each MRAM cell block includes 200 or fewer cells. In some embodiments, each MRAM cell block includes 100 or fewer cells. In some embodiments, each MRAM cell block has an area of about 10 μm2 or less. In some embodiments, each MRAM cell block has an area of about 4 μm2 or less. In some embodiments, each MRAM cell block has an area of about 1 μm2 or less. In some embodiments, each MRAM cell block has a width that is about 2 μm or less. The smaller the MRAM cell block, the greater the magnetic shielding efficiency of a magnetic shielding structure of a given thickness.

Providing shielding around MRAM cell blocks within the metal interconnect allows a given level of magnetic shielding efficiency to be achieved without the added thickness of package level magnetic shielding. In some embodiments, the magnetic shielding structure provides a magnetic shielding efficiency, which is a ratio of the incident magnet field intensity to the magnetic field intensity within the magnetic shielding structure, of about 1.5 or greater. In some embodiments, the magnetic shielding efficiency is about 2.0 or greater. These levels of magnetic shielding allow MRAM to remain stable at a significantly lower spin torque transfer (STT) efficiency than would otherwise be required, which in turn leads to a significant easing of manufacturing requirements. The magnetic shielding of the present disclosure is effective even against low frequency and static (DC) magnetic fields, which are particularly difficult to shield against.

In some embodiments, the metal interconnect includes a first layer set, a second layer, and a third layer set, each comprising one or more via and metallization layers. The third layer set is above the second layer set, which is above the first layer set, which is above a semiconductor substrate. The MRAM is formed within the second layer set. The wires and vias of the second layer set have a composition that includes the magnetic shielding material. In some embodiments, wires and vias of the first layer set have a composition with a higher conductance than that of wires and vias in the second layer set. In some embodiments, wires and vias of the third layer set have a composition with a higher conductance than that of wires and vias in the second layer set. The magnetic shielding material may be absent from the first layer set or the third layer set. The magnetic shielding material may lower conductivities as compared to wires and vias that are entirely copper, aluminum, or the like. A higher conductivity compositions in the third layer set and/or the first layer set may be used to mitigate the effect of using a lower conductivity composition in the second layer set to provide magnetic shielding.

In some embodiments, the metal interconnect that contains the MRAM and provides the magnetic shielding is provided over a first substrate and is combined with a second substrate on which are formed logic devices and over which is formed a second metal interconnect. The second metal interconnect has conductors with a composition that provides a higher conductivity then the composition of the conductors that provide the magnetic shielding structure. In some embodiments, the first substrate and the second substrate are stacked. In some embodiments, the MRAM with the magnetic shielding structure is in a standalone memory device. These embodiments provide options for reducing any adverse effects that result from incorporating a magnetic shielding material into the conductors of the metal interconnect.

FIG. 1 illustrates an IC device 100 according to some aspects of the present disclosure. The IC device 100 includes a metal interconnect 141 over a semiconductor substrate 133. The metal interconnect 141 includes, in order above the semiconductor substrate 133, a first layer set 139, a second layer set 145, and a third layer set 151. Each of the first layer set 139, the second layer set 145, and the third layer set 151 may include one or more metallization layers 131 comprising wires 121 and one or more via layers 135 comprising vias 123. Etch stop layers 129 may be present and in alignment with the bottoms of the via layers 135. The wires 121 and the vias 123 may be disposed within interlevel dielectric (ILD) layers 127. The wires 121 and the vias 123 in the first layer set 139 and/or the third layer set 151 may have a composition distinct from that of the wires 121 and the vias 123 in the second layer set 145. In some embodiments, this distinct composition includes a diffusion barrier layer 125 that is absent from the wires 121 and the vias 123 of the second layer set 145.

An MRAM cell block 115 comprising an array of MRAM cells 113 is disposed within the second layer set 145. A magnetic shielding structure 111 formed by the second layer set 145 surrounds the MRAM cell block 115. The magnetic shielding structure 111 include a top portion 109 that is above the MRAM cell block 115, a side portion 117 that goes around the sides of the MRAM cell block 115, and a bottom portion 119 that is underneath the MRAM cell block 115. The magnetic shielding structure 111 may provide a magnetic shielding efficiency greater than about 2.0 particularly if the MRAM cell block 115 has an area of about 1 $\mu m^2$ or less.

Figure 2A:
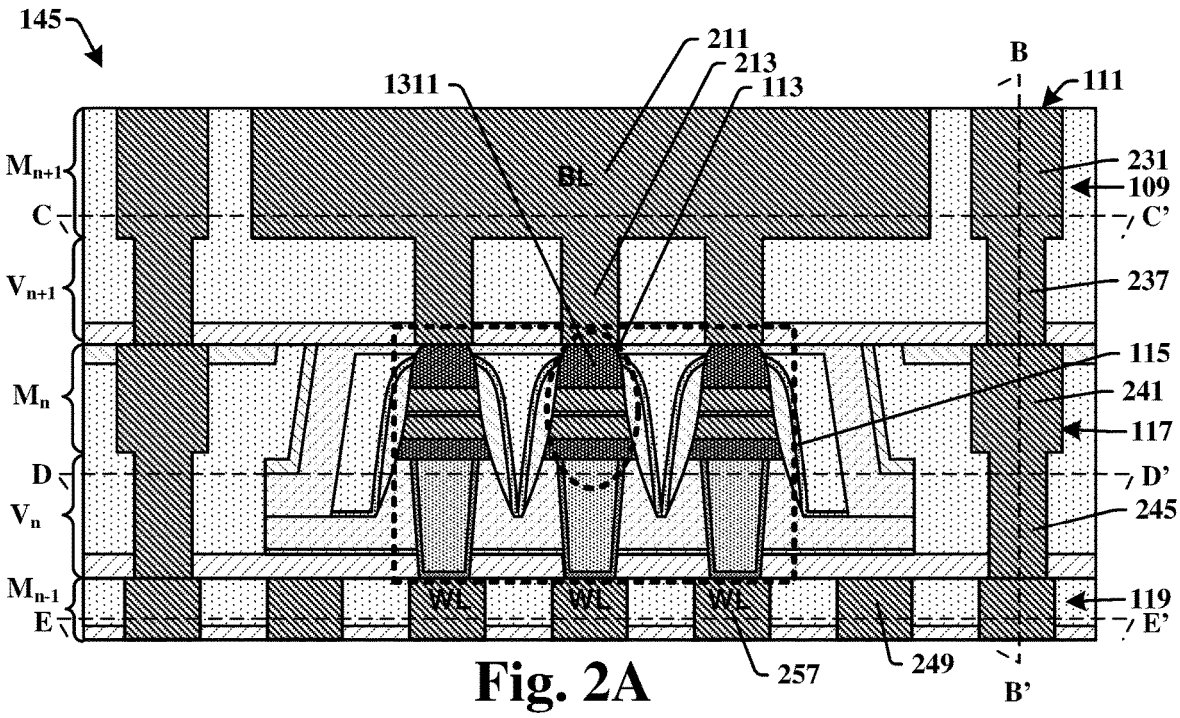
FIG. 2A illustrates an MRAM cell block and a magnetic shielding structure of the IC device of FIG. 1.

FIG. 2A provides a cross-sectional view focused on the second layer set 145 which contains the MRAM cell block 115 and the magnetic shielding structure 111 of the IC device 100. As shown by FIG. 2A, the second layer set 145 includes metallization layers $M_{n-1}$, $M_n$, and $M_{n+1}$ and a via layers $V_n$ and $V_{n+1}$. The metallization layer $M_{n+1}$ provides the top portion 109 of the magnetic shielding structure 111. The metallization layer $M_n$ and the via layers $V_n$ and $V_{n+1}$ provide the side portion 117. The metallization layer $M_{n-1}$ provides the bottom portion 119.

Figure 2B:
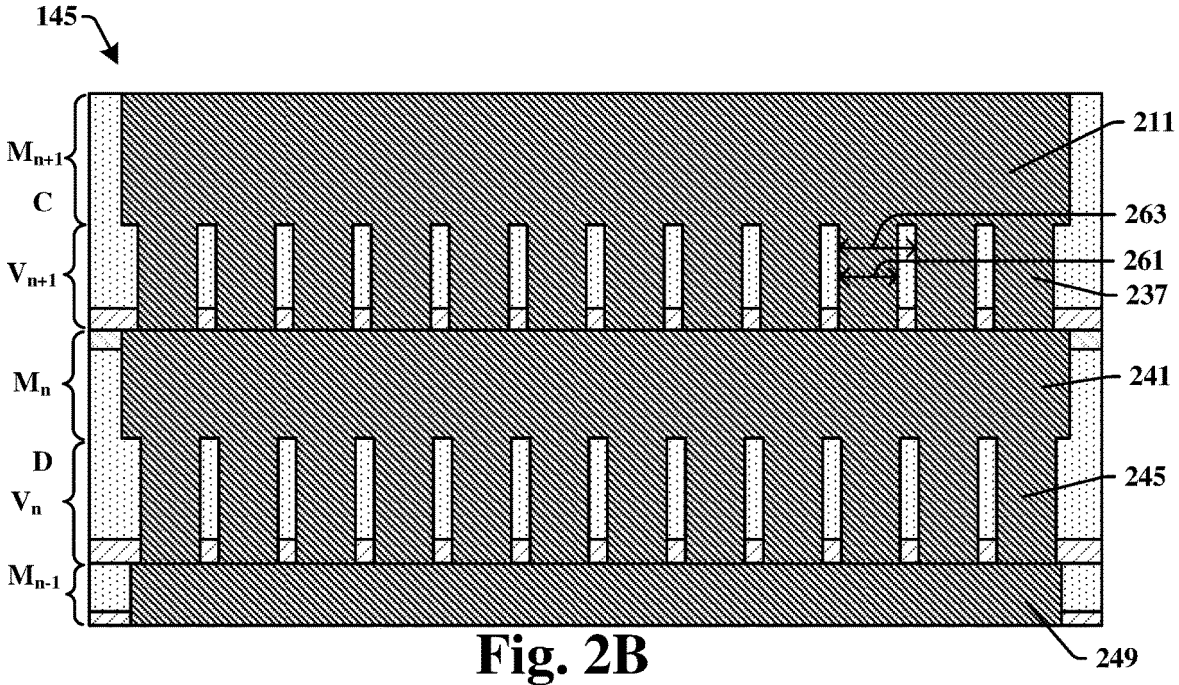
FIG. 2B illustrates another cross-section of the IC device of FIG. 1 corresponding to the line B-B' of FIG. 2A.
Figure 2C:
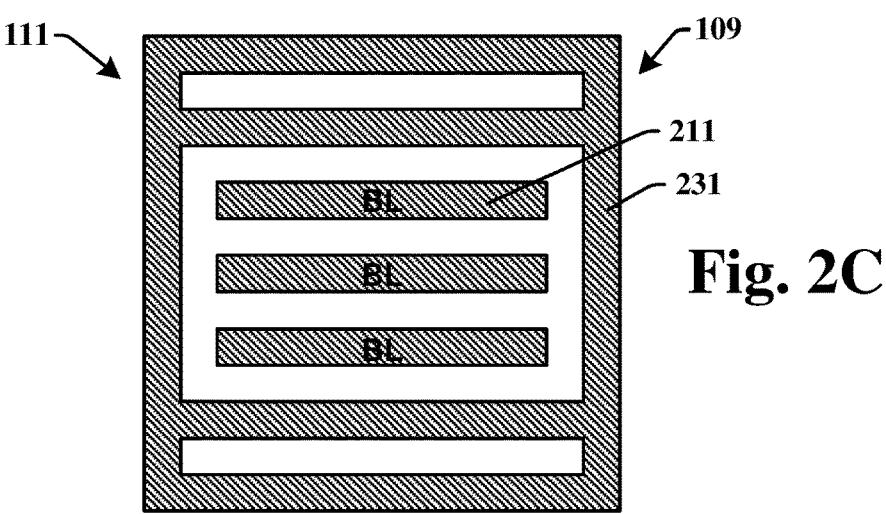
FIG. 2C illustrates a cut-away top view a magnetic shielding structure according to some aspects of the present disclosure, with the cut-away corresponding to the line C-C' of FIG. 2A.
Figure 2D:
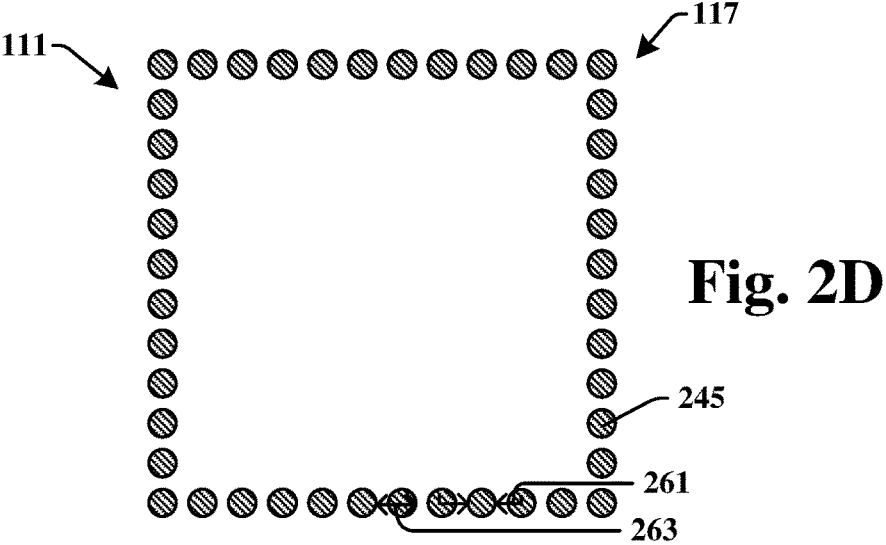
FIG. 2D illustrates a cut-away top view a magnetic shielding structure according to some aspects of the present disclosure, with the cut-away corresponding to the line D-D' of FIG. 2A.
Figure 2E:
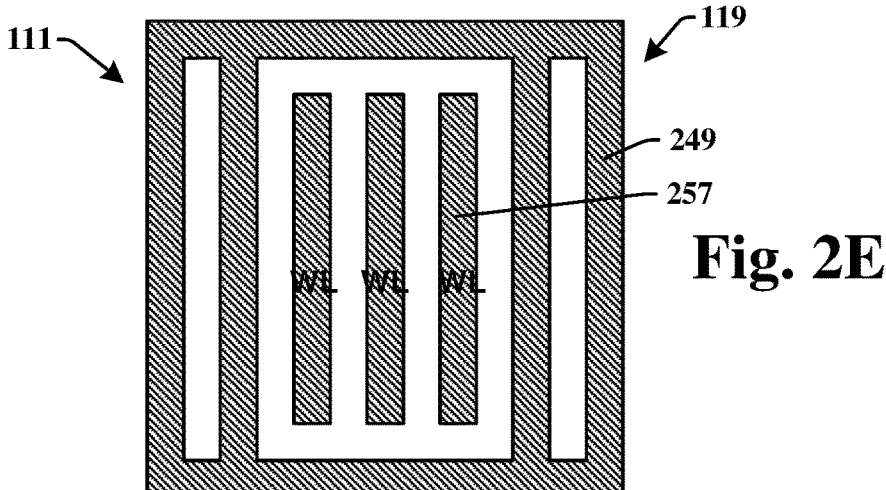
FIG. 2E illustrates a cut-away top view a magnetic shielding structure according to some aspects of the present disclosure, with the cut-away corresponding to the line E-E' of FIG. 2A.

FIG. 2B provides a side view 200 taken along the line B-B' of FIG. 2A. FIGS. 2C, 2D, and 2E provide cross-sectional views of the magnetic shielding structure 111 taken, respectively, along the lines C-C', D-D', and E-E' of FIG. 2A. As shown by these illustrations, the top portion 109 of the magnetic shielding structure 111 may include bit lines 211 for the MRAM cell block 115 and additional wires 231. The bottom portion 119 may include word lines 257 and additional wires 249. The side portion 117 may include vias 245, additional wires 241, and vias 237.

Parts of the magnetic shielding structure 111 such as the additional wires 231, the additional wires 249, the vias 245, the additional wires 241, and the vias 237 may be non-functional in terms of forming the electrical connections provided by the metal interconnect 141. Functional electrical connections have two terminals each of which is coupled to a functionally distinct electrode, contact, the like, or other structure. The non-electrically functional wires and vias may form structures that are floating, are coupled to ground, or dangle off electrically functional structures.

Figure 3:
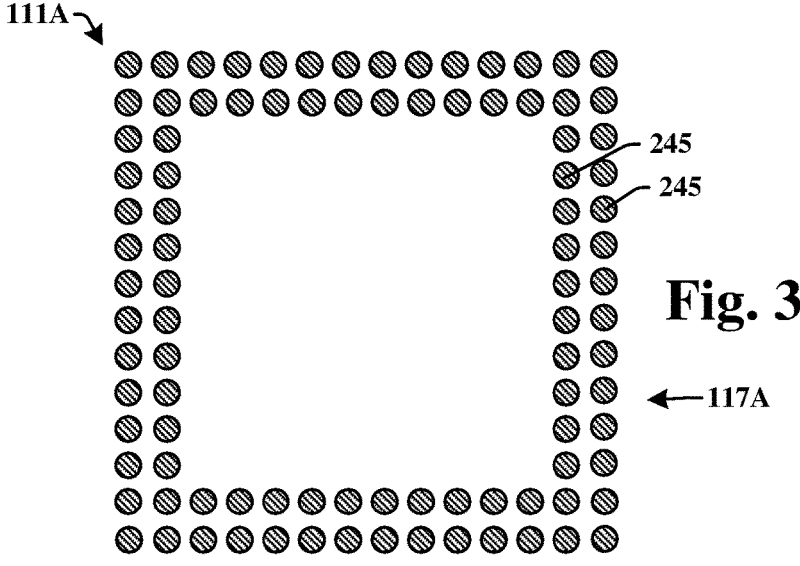
FIG. 3 illustrates a cut-away top view a magnetic shielding structure according to some other aspects of the present disclosure.

With reference to FIGS. 2B and 2D, the side portion 117 forms a fence around the MRAM cell block 115 and may include a row of vias 245 encircling the MRAM cell block 115. The vias may be periodically spaced. In some embodiments, a ratio between a width 261 and a pitch 263 of the vias 245 is about 0.5 or greater. In some embodiments, the side portion 117 covers 50% or more a side area around the MRAM cell block 115. In some embodiments, the pitch 263 is about 100 $\mu m$ or less. In some embodiments, the pitch 263 is about 40 $\mu m$ or less. In some embodiments, the vias 245 are connected by structures such as the additional wires 241, whereby the side portion 117 is a continuous structure. Providing a high area density for the side portion 117 is an efficient way of improving the performance of the magnetic shielding structure 111. In some embodiments, the side portion comprises two or more concentric rings of vias 245. FIG. 3 provides a cross-sectional view of a magnetic shielding structure 111A in which the side portion 117A comprises two concentric rings of vias 245.

The metallization layers $M_{n-1}$, $M_n$, and $M_{n+1}$ and the via layers $V_n$ and $V_{n+1}$ of the second layer set 145 comprise a magnetic shielding material. A magnetic shielding material is one having a high permeability (μ) and saturation magnetization. The magnetic shielding materials may be, for example, cobalt (Co), a silicon steel (FeSi), an iron-nickel alloy (NiFe), a cobalt-iron alloy (CoFe), a cobalt iron boron alloy (CoFeB), an iron boron alloy (FeB), a nickel zinc alloy (NiZn), a neodymium iron boron alloy (NdFeB), a combination thereof, or the like. In some embodiments, the magnetic shielding material has at least the permeability of cobalt (Co). In some embodiments, the magnetic shielding material has a permeability greater than that of cobalt (Co). In some embodiments, the magnetic shielding material has a relative permeability of about 100 or greater. In some embodiments, the magnetic shielding material has a saturation magnetization of about 0.8 Tesla or greater. A magnetic material having a high permeability and a high saturation magnetization facilitates making the magnetic shielding structure 111 efficient without occupying excessive chip area.

Figure 4:
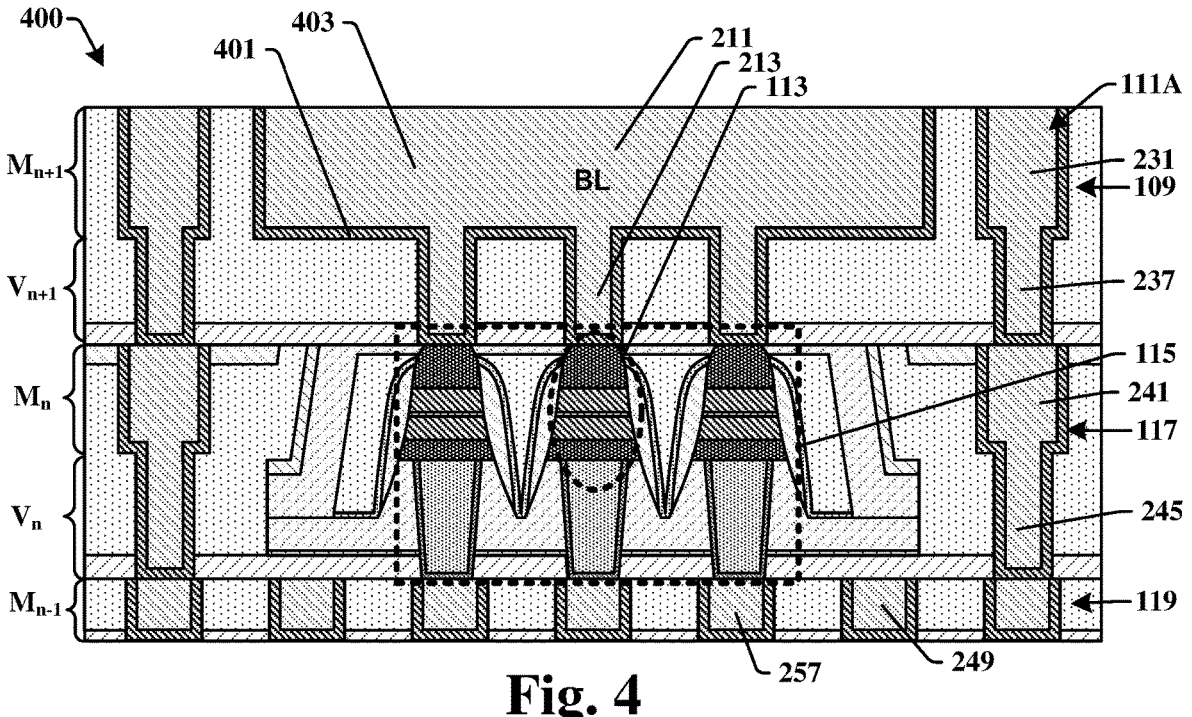
FIG. 4 illustrates an MRAM cell block with a magnetic shielding structure according to some other aspects of the present disclosure.

In the example illustrated by FIGS. 2A-2E, the magnetic shielding material forms the metallization layers $M_{n-1}$, $M_n$, and $M_{n+1}$ and the via layers $V_n$ and $V_{n+1}$ of the second layer set 145. FIG. 4 provides a cross-sectional view 400 of an alternate embodiment in which the magnetic shielding material forms a liner 401 for the metallization layers $M_{n-1}$, $M_n$, and $M_{n+1}$ and the via layers $V_n$ and $V_{n+1}$. The liner 401 surrounds a core 403 that comprises a metal that is more conductive than the magnetic shielding material. The metal may be, for example, aluminum (Al), copper (Cu), a combination thereof, or the like. The magnetic shielding material may form the bottoms of the word lines 257 and the additional wires 249 of the metallization layers $M_{n-1}$. On the other hand, the via layer $V_n$ and the metallization layer $M_n$ may be the product of a dual damascene process whereby the liner 401 extends around the vias 245 and the additional wires 241 but does not separate the vias 245 from the additional wires 241. Likewise, the liner 401 may extend around the vias 237 and the additional wires 231 without coming between the vias 237 from the additional wires 231.

Figure 5:
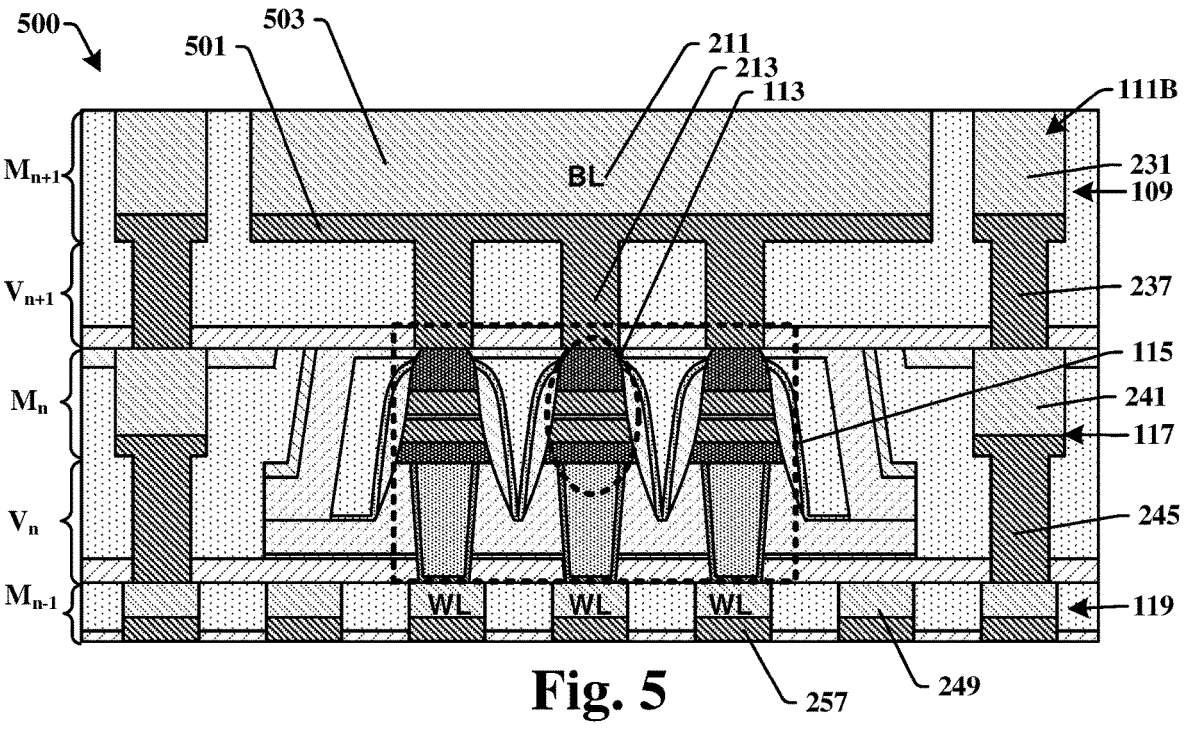
FIG. 5 illustrates an MRAM cell block with a magnetic shielding structure according to some other aspects of the present disclosure.

FIG. 5 provides a cross-sectional view 500 that illustrates a magnetic shielding structure 111B having an alternative deployment of the magnetic shielding material. In this alternative, the metallization layers $M_{n-1}$, $M_n$, and $M_{n+1}$ comprise magnetic layers 501 and more conductive layers 503. The magnetic shielding material forms the magnetic layers 501. The metal that is more conductive than the magnetic shielding material provides the more conductive layers 503. In the illustrated embodiment, the via layers $V_n$ and $V_{n+1}$ are formed entirely by the magnetic shielding material and the metallization layers $M_{n-1}$, $M_n$, and $M_{n+1}$ each comprise one magnetic layer 501 and one conductive layer 503. In some embodiments, the via layers $V_n$ and $V_{n+1}$ comprise both the magnetic layer 501 and the conductive layer 503. In some embodiments, one or more of the metallization layers $M_{n-1}$, $M_n$, and $M_{n+1}$ includes a second magnetic layer 501, a second conductive layer 503, both a second magnetic layer 501 and a second conductive layer 503, or a greater number of layers. In the illustrated embodiment, the conductive layer 503 is formed above the magnetic layer 501. In alternate embodiments, the arrangement of these layers is reversed.

Returning to FIG. 1, a composition of the wires 121 and the vias 123 in the first layer set 139 may provide a higher conductivity than a composition of the wires 121 and the vias 123 in the second layer set 145. In some embodiments, the wires 121 and vias 123 in the first layer set 139 lack the magnetic shielding material. In some embodiments, the wires 121 and vias 123 in the first layer set 139 comprise aluminum (Al), copper (Cu), a combination thereof, or the like. Likewise, a composition of the wires 121 and vias 123 in the third layer set 151 may provide a higher conductivity than a composition of the wires 121 and vias 123 in the second layer set 145. In some embodiments, the wires 121 and vias 123 in the third layer set 151 lack the magnetic shielding material. In some embodiments, the wires 121 and vias 123 in the third layer set 151 comprise aluminum (Al), copper (Cu), a combination thereof, or the like.

In some embodiments, the first layer set 139 has the same composition as the second layer set 145. In some embodiments, the third layer set 151 has the same composition as the second layer set 145. Including the magnetic shielding material in these other layer sets may increase the magnetic shielding of the MRAM cell block 115. There is, however, a tradeoff between conductivity within the metal interconnect 141 and more extensive use of the magnetic shielding material. One way of reducing any consequences of such a tradeoff by making the IC device 100 a standalone memory device or by offloading some functions to a second substrate with a higher speed metal interconnect.

Figure 6:
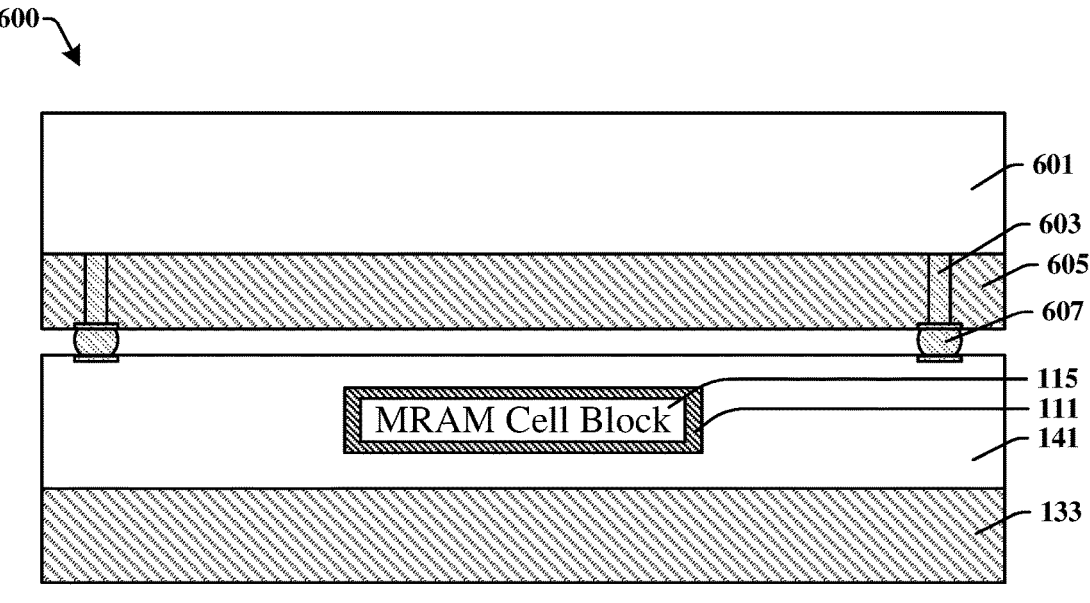
FIG. 6 illustrates a 3-D IC device comprising an MRAM cell block with a magnetic shielding structure according to some other aspects of the present disclosure.

FIG. 6 provides a schematic illustration of an IC device 600 that includes components of the IC device 100, a second substrate 605, and a second metal interconnect 601. The included components of the IC device 100 may comprise the substrate 133, the metal interconnect 141, the MRAM cell block 115, and the magnetic shielding structure 111. The second substrate 605 may support logic and other devices that use, cooperate with, or augment the function of the MRAM cell block 115. The second metal interconnect 601 may include conductors formed by a distinct and higher conductivity composition than the conductors (wires 121 and vias 123) of the metal interconnect 141. The higher conductivity composition may include copper (Cu), aluminum (Al), an alloy thereof or the like and may be free from the magnetic shielding material. The second metal interconnect 601 may be coupled to metal interconnect 141 by through substrate vias (TSVs) 603, solder bumps 607, the like, or other suitable coupling structures.

FIGS. 7A to 7E illustrate a second layer set 145C forming a magnetic shielding structure 111C according to some other embodiments of the present disclosure. The magnetic shielding structure 111C is generally similar to the magnetic shielding structure 111 of FIG. 2A-2E. Differences arise from the second layer set 145C having bit lines 211C that extend past the additional wires 231C (See FIG. 7C). By contrast, with reference to FIG. 2C, in the magnetic shielding structure 111 the bit lines 211 are surrounded by and terminate short of the additional wires 231.

Figure 7A:
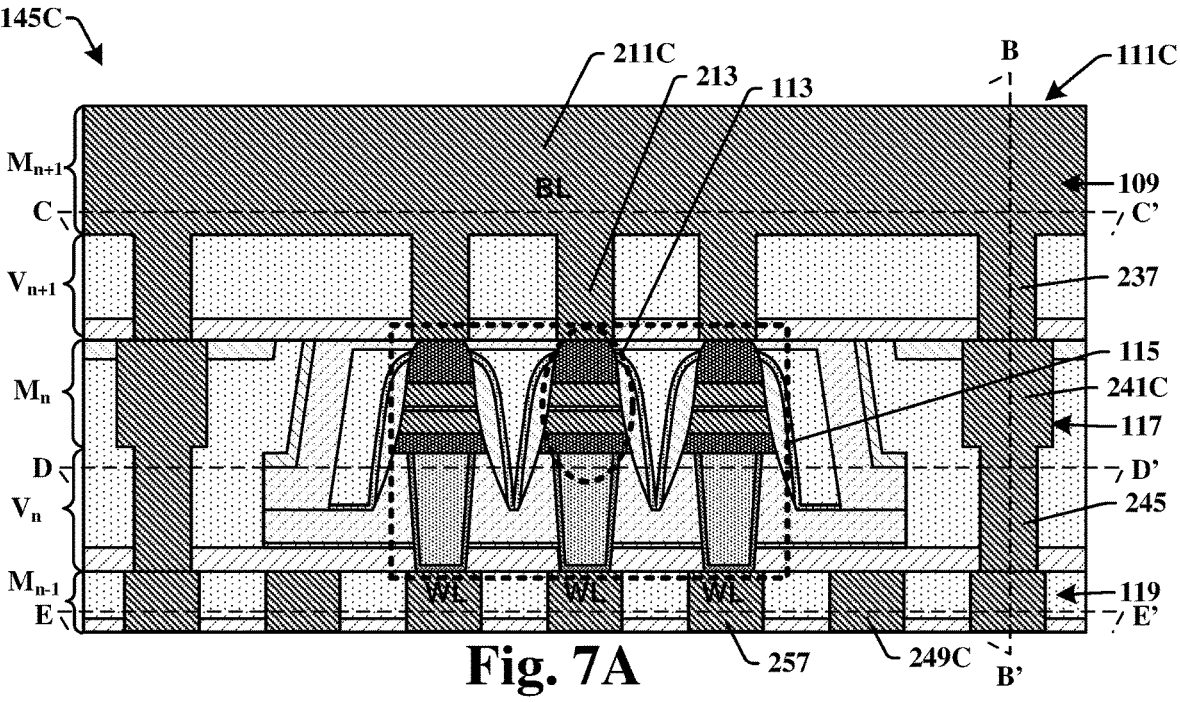
FIGS. 7A-7E illustrate an MRAM cell block with a magnetic shielding structure according to some other aspects of the present disclosure.
Figure 7B:
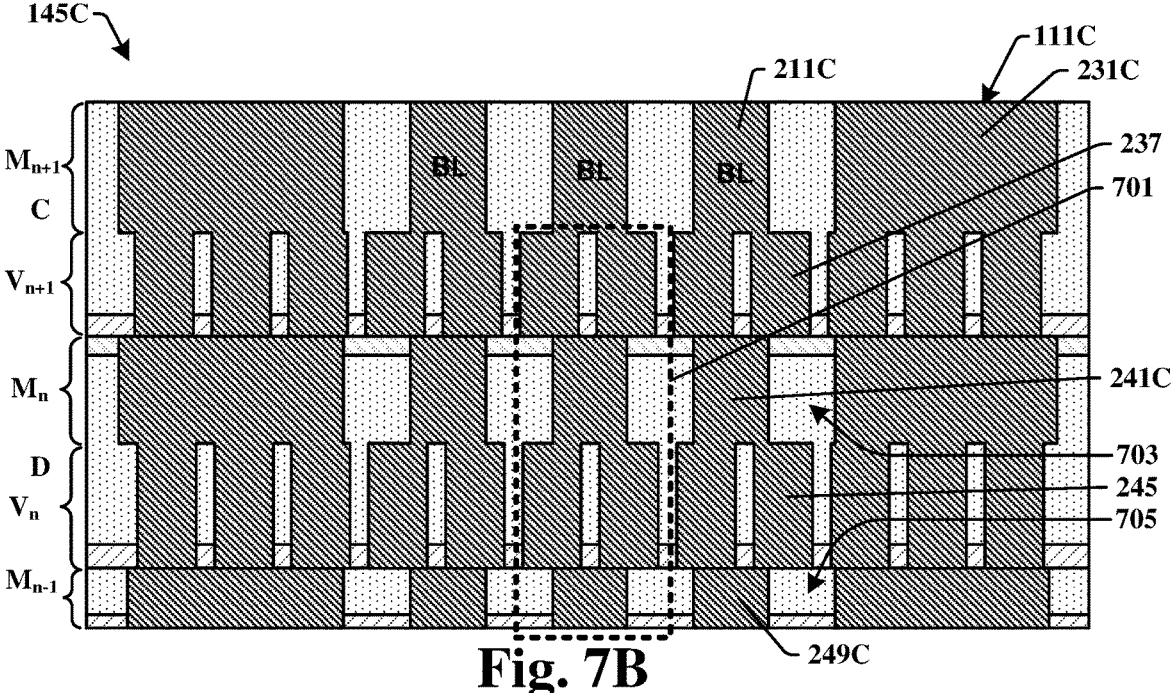
Figure 7C:
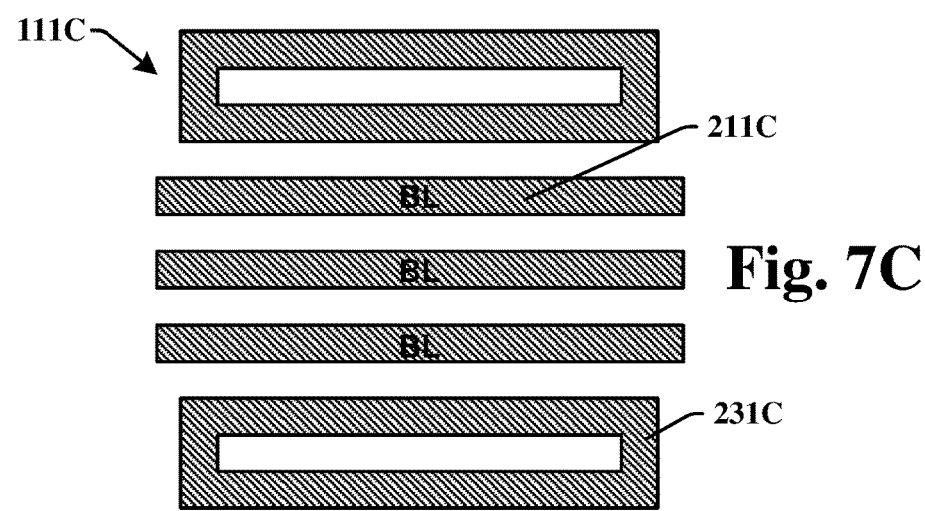
Figure 7D:
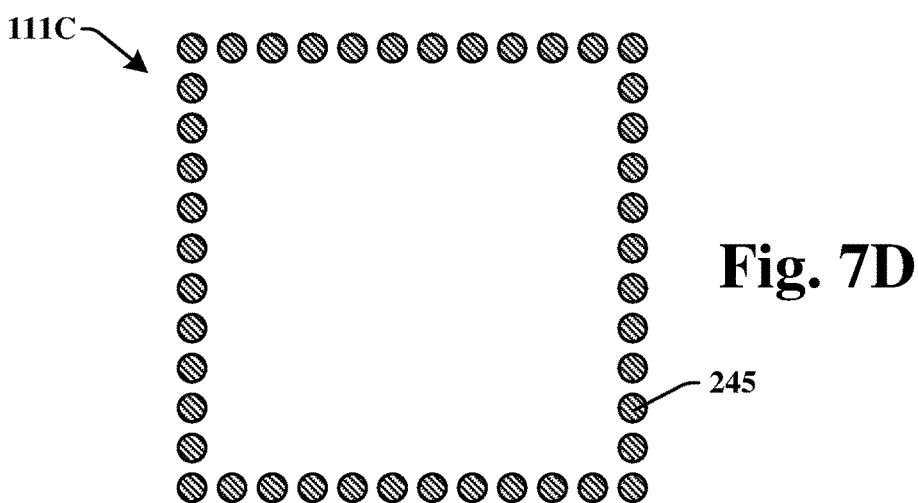
Figure 7E:
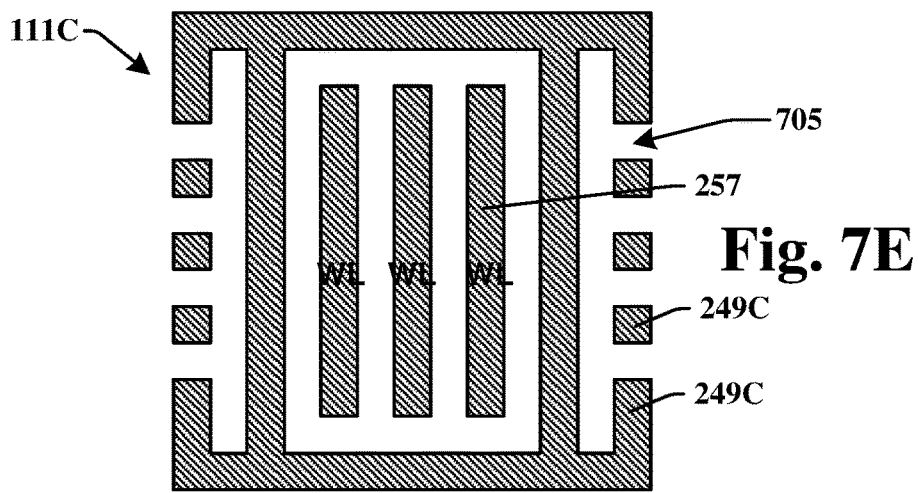

As illustrated by FIG. 7B, the use of longer bit lines 211C entails some modifications to prevent shorting. These modifications include gaps 703 in the additional wires 241C and gaps 705 in the additional wires 249C (See FIG. 7E). Referring again to FIG. 7B, the magnetic shielding structure 111C may include structures 701 composed of vias 237, additional wires 241C, vias 245, and additional wires 249C that dangle off bit lines 211C. The structures 701 are dangling in the sense that each is connected to a bit line 211C but the structures 701 do not connect the bit lines 211C to any other structure.

Figure 8:
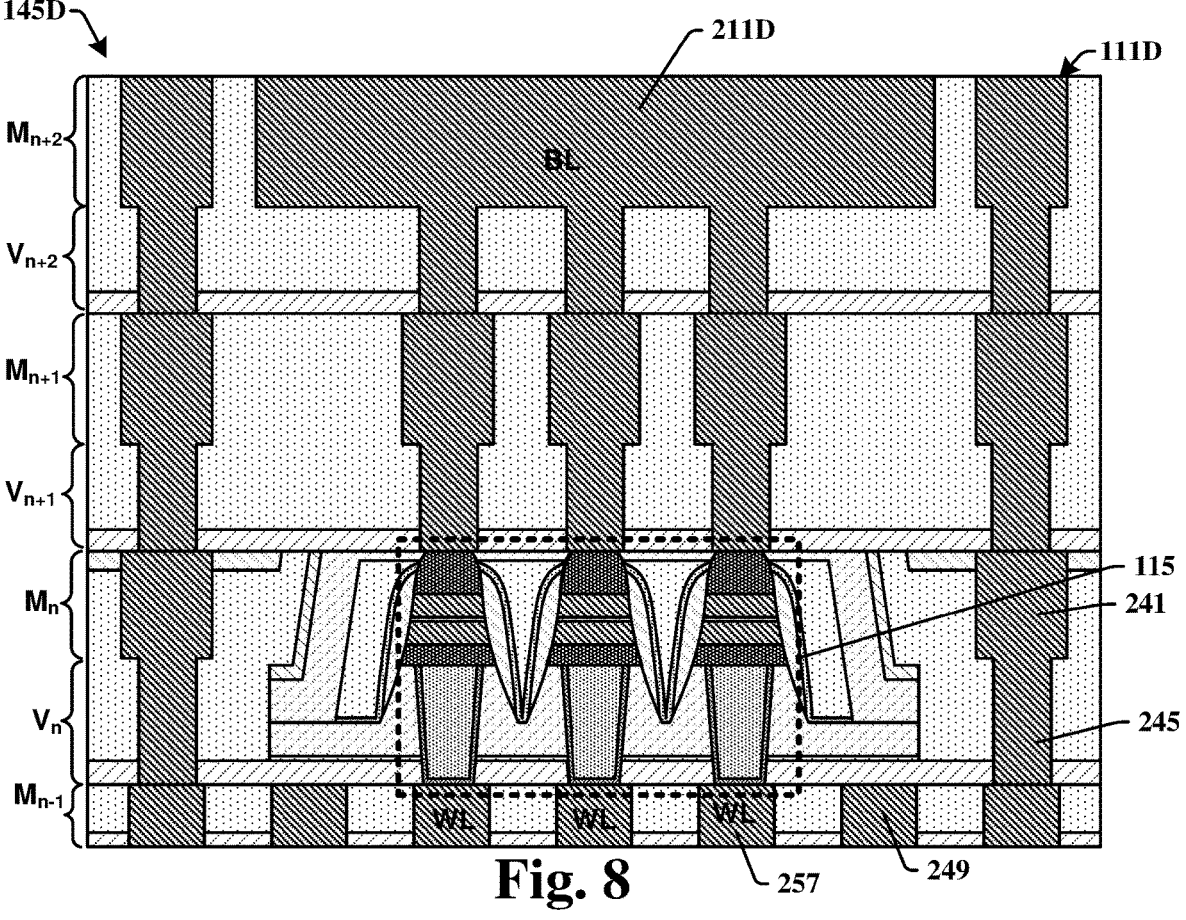
FIG. 8 illustrates an MRAM cell block with a magnetic shielding structure according to some other aspects of the present disclosure.

FIG. 8 illustrates a second layer set 145D forming a magnetic shielding structure 111D according to some other embodiments of the present disclosure. The second layer set 145D includes a via layer $V_{n+2}$ and a metallization layer $M_{n+2}$. In this alternate embodiment, the top portion 109 of the magnetic shielding structure 111D, which may include the bit lines 211D, is disposed in the metallization layer $M_{n+2}$. This structure provides a higher magnetic shielding factor than the magnetic shielding structure 111 of FIGS. 2A to 2E.

The substrate 133 may be any type of substrate. In some embodiments, the substrate 133 comprises a semiconductor body, e.g., silicon, SiGe, silicon-on-insulator (SOI), or the like. The substrate 133 may be a semiconductor wafer, one or more dies on a wafer, or any other type of semiconductor body and/or epitaxial layers associated therewith. With reference to FIG. 1, The substrate 133 may support transistors 134 that are used to operate the MRAM cells 113.

FIGS. 9 through 24 present a series of cross-sectional views exemplifying a method according to the present disclosure of forming a magnetic shielding structure. While FIGS. 9 through 24 are described with reference to various embodiments of a method, it will be appreciated that the structures shown in FIGS. 9 through 24 are not limited to the method but rather may stand alone separate from the method. FIGS. 9 through 24 are described as a series of acts the order of which may be altered in other embodiments. While FIGS. 9 through 24 illustrate and describe a specific set of acts, some may be omitted in other embodiments. Further, acts that are not illustrated and/or described may be included in other embodiments. While the method of FIGS. 9 through 24 illustrates the formation of the IC device 100, the method may be used to form other IC devices according to the present disclosure.

Figure 9:
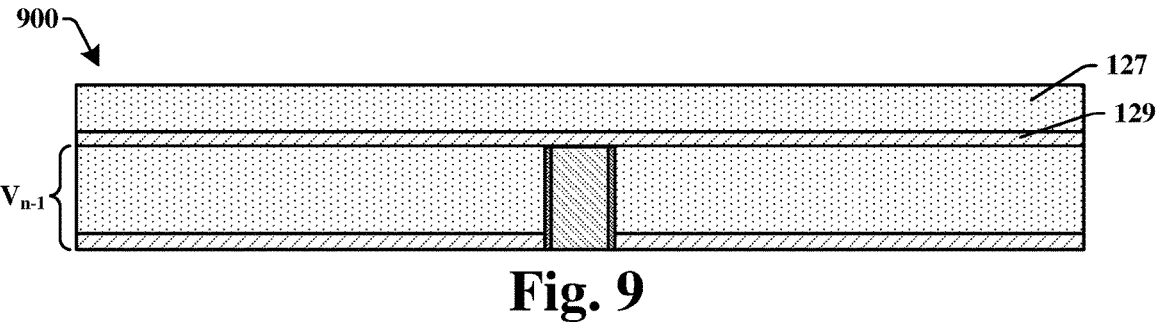
FIGS. 9-24 illustrate a method according to the present disclosure of forming a magnetic shielding structure according to the present disclosure.

As shown by the cross-sectional view 900 of FIG. 9, the method may begin with the formation of an etch stop layer 129 and an ILD layer 127 over a via layer Vn−1. In some embodiments, n is a number in the range from 3 to 7, the via layers being number in order of height above the substrate 133 beginning with V1 as the via layer 135 that is immediately above a layer that contains contact plugs 137 (see FIG. 1). In some embodiments, n is the range from 4 to 6. In some embodiments, n is 5 or greater.

The etch stop layer 129 and the ILD layer 127 may have any suitable compositions and may be formed by any suitable process. The etch stop layer 129 is a dielectric and may be, for example, a nitride (e.g., silicon nitride, silicon oxy-nitride, etc.), a carbide (e.g., silicon carbide, silicon oxy-carbide etc.), or the like. The ILD layer 127 may be an oxide (e.g., silicon dioxide (SiO2, etc.), a low-k dielectric, or an extremely low-k dielectric. The etch stop layer 129 and the ILD layer 127 may each be formed by, for example, chemical vapor deposition (CVD), plasma-enhanced chemical vapor deposition (PECVD), atomic layer deposition (ALD), or the like. In some embodiments, the ILD layer 127 is formed from tetraethyl orthosilicate (TEOS).

Figure 10:
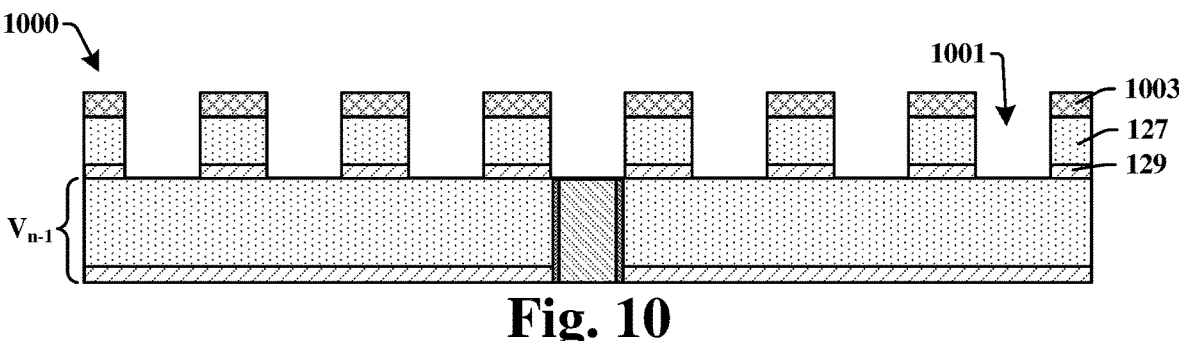

As shown by the cross-sectional view 1000 of FIG. 10, the method may continue with the formation of a mask 1003 and using the mask 1003 to etch openings 1001 through the ILD layer 127 and the etch stop layer 129. That mask 1003 may be patterned by photolithography. The etch process may include plasma etching. The etch stop layer 129 facilitates limiting an extent of the etch process. After etching is complete, the mask 1003 may be stripped.

Figure 11:
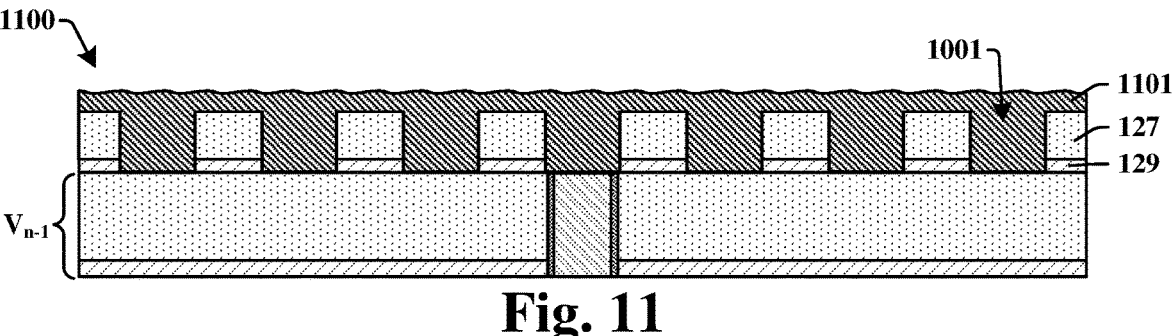

As shown by the cross-sectional view 1100 of FIG. 11, the process may continue with deposition of metal 1101 to fill the openings 1001. In some embodiments, the metal 1101 is the magnetic shielding material. In other embodiments the metal 1101 includes materials in addition to the magnetic shielding material. In some embodiments, the metal 1101 includes multiple layers at least one of which is a metal more conductive than magnetic shielding material. In some embodiments, filling the opening 1001 include depositing a diffusion barrier layer. A diffusion barrier layer may be, for example, a compound of a transition metal such as tantalum nitride (TaN), titanium nitride (TiN), tungsten nitride (WN), or the like. The metal 1101 may be deposited by one or more processes such as physical vapor deposition (PVD), chemical vapor deposition (CVD), atomic layer deposition (ALD), plating (electrolytic or electroless), a combination thereof, or the like.

Figure 12:
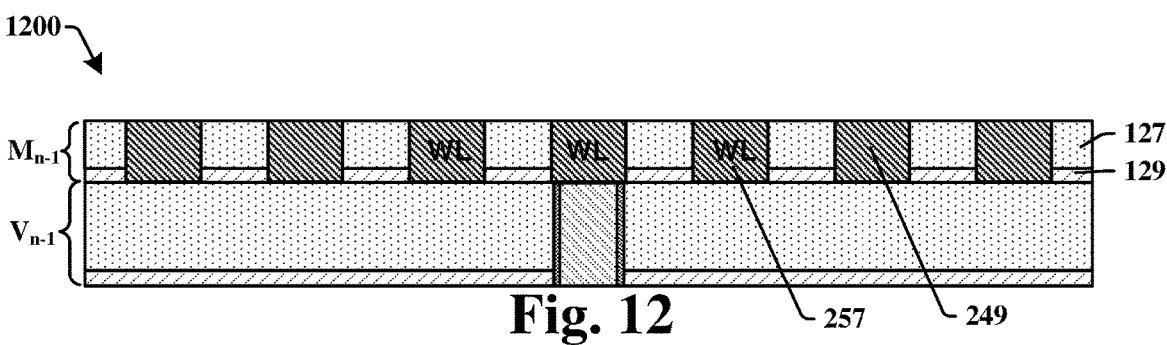

As shown by the cross-sectional view 1200 of FIG. 12, a process may be carried out to remove any of the metal 1101 that has deposited outside the openings 1001 and define the word lines 257 and the additional wires 249 of the $M_{n-1}$ metallization layer from the metal 1101. The process may be, for example, chemical mechanical polishing (CMP).

Figure 13:
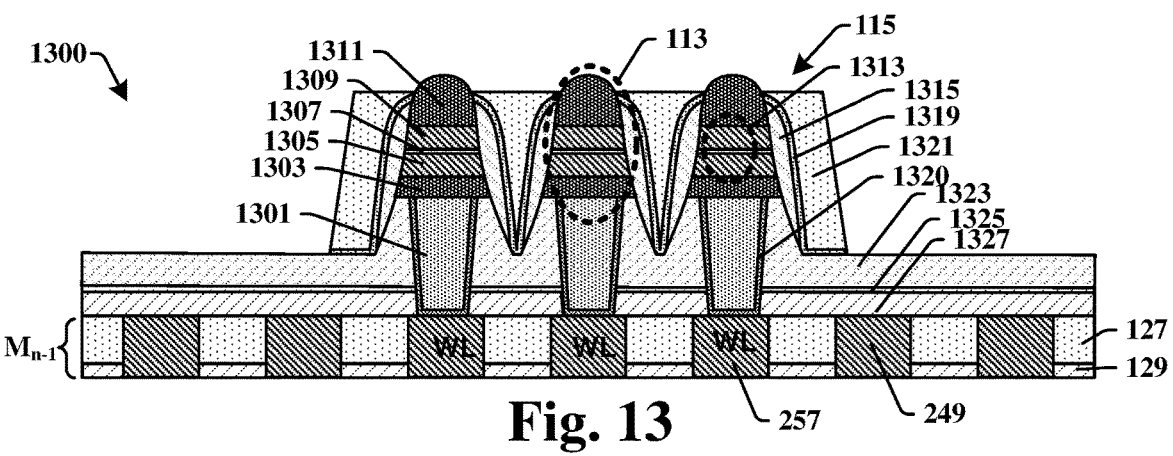

As shown by the cross-sectional view 1300 of FIG. 13, the MRAM cell block 115 may be formed over the $M_{n-1}$ metallization layer. The MRAM cell block 115 includes an array of MRAM cells 113. Each of the MRAM cells 113 comprises a data storage structure such as a magnetic tunnel junction (MTJ) 1313 sandwiched between a bottom electrode 1303 and a top electrode 1311. The MTJs 1313 may include a lower magnetic layer 1305 and an upper magnetic layer 1309 separated by a tunnel barrier layer 1307. The lower magnetic layer 1305 and the upper magnetic layer 1309 may be ferromagnetic materials such as cobalt-iron-boron (CoFeB), cobalt-iron (CoFe), and nickel-iron (NiFe), cobalt (Co), iron (Fe), nickel (Ni), iron-boron (FeB), iron-platinum (FePt), or the like. The tunnel barrier layer 1307 may be a metal oxide such as magnesium oxide (MgO), aluminum oxide ($Al_2O_3$), or the like.

The MRAM cells 113 may be surrounded by dielectrics such as first sidewall spacers 1315, a passivation layer 1319, and a second sidewall spacers 1321. The first sidewall spacers 1315 may be, for example, a nitride (e.g., silicon oxy-nitride, silicon nitride, etc.), a carbide (e.g., silicon carbide, silicon oxy-carbide etc.), or the like. The passivation layer 1319 may be, for example, a metal-oxide (e.g., aluminum-oxide, hafnium-oxide, etc.), or the like. The second sidewall spacers 1321 may be, for example, an oxide (e.g., silicon dioxide ($SiO_2$, etc.). Some of these dielectric layers may be absent. There may also be additional dielectric layers around the MRAM cells 113.

The bottom electrodes 1303 are connected to word lines 257 by bottom electrode vias 1301. The bottom electrodes 1303, the top electrodes 1311, and the bottom electrode vias 1301 may be, for example, titanium (Ti), tantalum (Ta), titanium nitride (TiN), tantalum nitride (TaN), platinum (Pt), gold (Au), iridium (Jr), tungsten (W), nickel (Ni), ruthenium (Ru), copper (Cu), tungsten silicide (WSi), combinations thereof, or the like. The bottom electrode vias 1301 may pass through dielectric layers including a first etch stop layer 1327, a second etch stop layer 1325, and an insulating layer 1323, although a greater or fewer number of dielectric layers may be used. The first etch stop layer 1327 may be, for example, a nitride (e.g., silicon oxy-nitride, silicon nitride, etc.), a carbide (e.g., silicon carbide, silicon oxy-carbide etc.), or the like. The second etch stop layer 1325 may be, for example, a nitride (e.g., silicon oxy-nitride, silicon nitride, etc.), a carbide (e.g., silicon carbide, silicon oxy-carbide etc.), a metal-oxide (e.g., aluminum-oxide, hafnium-oxide, etc.), or the like. The insulating layer 1323 may be an oxide (e.g., silicon dioxide ($SiO_2$, etc.) a low-k dielectric, or an extremely low-k dielectric. A barrier layer 1320 may separate the bottom electrode vias 1301 from the dielectrics and may be, for example, tantalum nitride (TaN), titanium nitride (TiN), or the like. MRAM cell block 115 may be formed by any suitable process or combination of processes.

Figure 14:
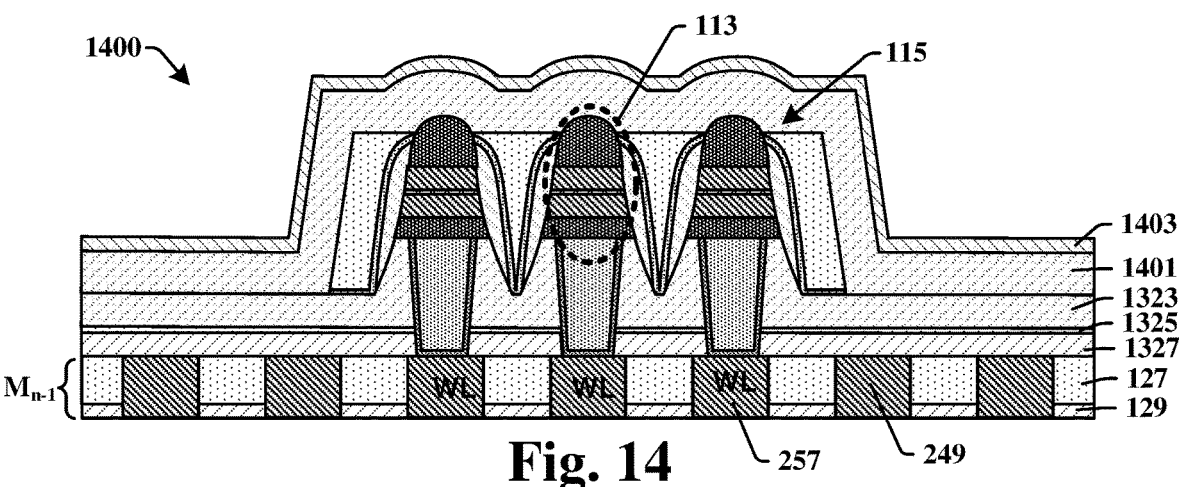

As shown by the cross-sectional view 1400 of FIG. 14, a memory interlevel dielectric layer 1401 and a nitrogen-free anti-reflective layer (NFARL) 1403 may be formed over the structure illustrated by the cross-sectional view 1300 of FIG. 13. The memory interlevel dielectric layer 1401 may be, for example, an oxide layer formed from TEOS, a low-k dielectric layer, or an extremely low-k dielectric layer. The NFARL 1403 may be, for example silicon-rich oxide (SRO), silicon oxycarbide, or the like. These layers may be formed, for example, by CVD, PECVD, ALD, or the like.

Figure 15:
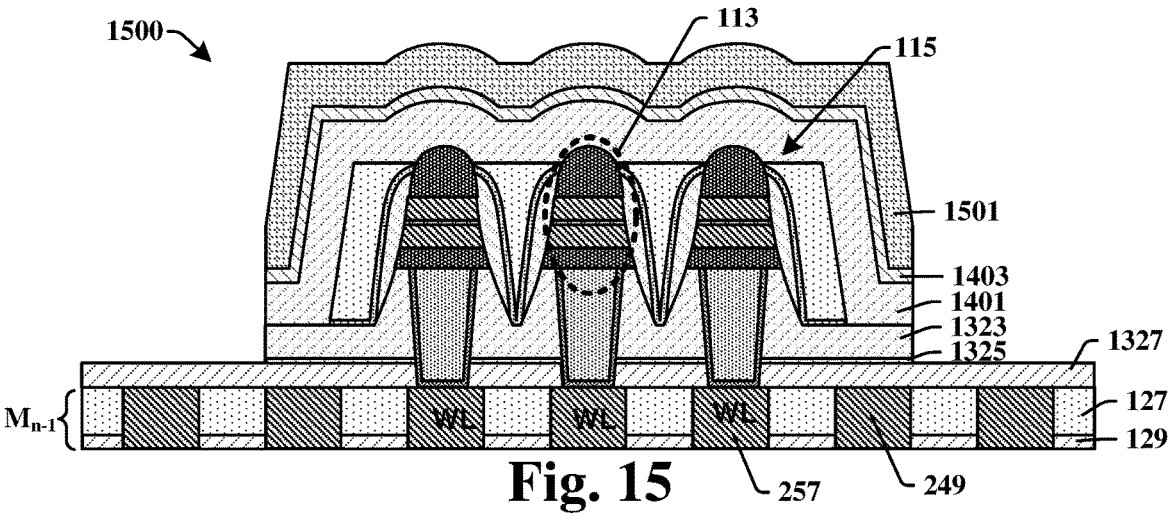

As shown by the cross-sectional view 1500 of FIG. 15, a mask 1501 may be formed by photolithography and used to etch the NFARL 1403, the memory interlevel dielectric layer 1401, the insulating layer 1323, and the second etch stop layer 1325 from an area around the MRAM cell block 115. The etching may include plasma etching that stops on the first etch stop layer 1327. After etching, the mask 1501 may be stripped.

Figure 16:
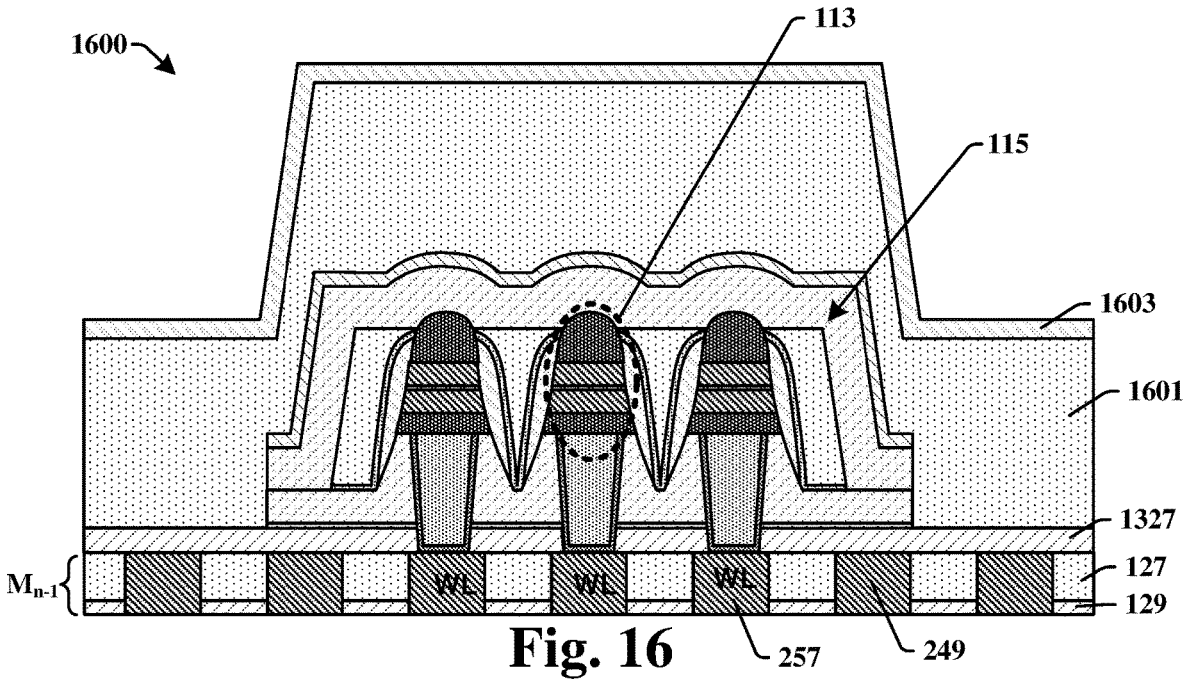

As shown by the cross-sectional view 1600 of FIG. 16, an ILD layer 1601 and an NFARL 1603 may be deposited over the structure illustrated by the cross-sectional view 1500 of FIG. 15. These layers may be deposited by CVD, PECVD, ALD, or the like.

Figure 17:
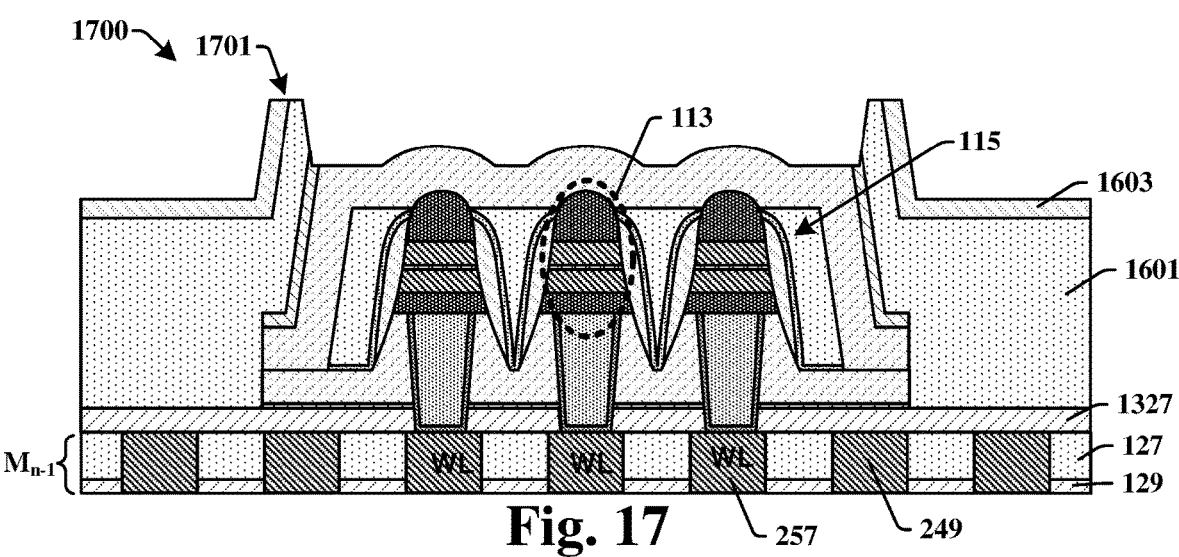

As shown by the cross-sectional view 1700 of FIG. 17, the ILD layer 1601 and the NFARL 1603 may be removed from an area over the MRAM cell block 115. The removal process may include etching with a mask (not shown). A buffing process may also be used to reduce a height of the boundary structure 1701.

Figure 18:
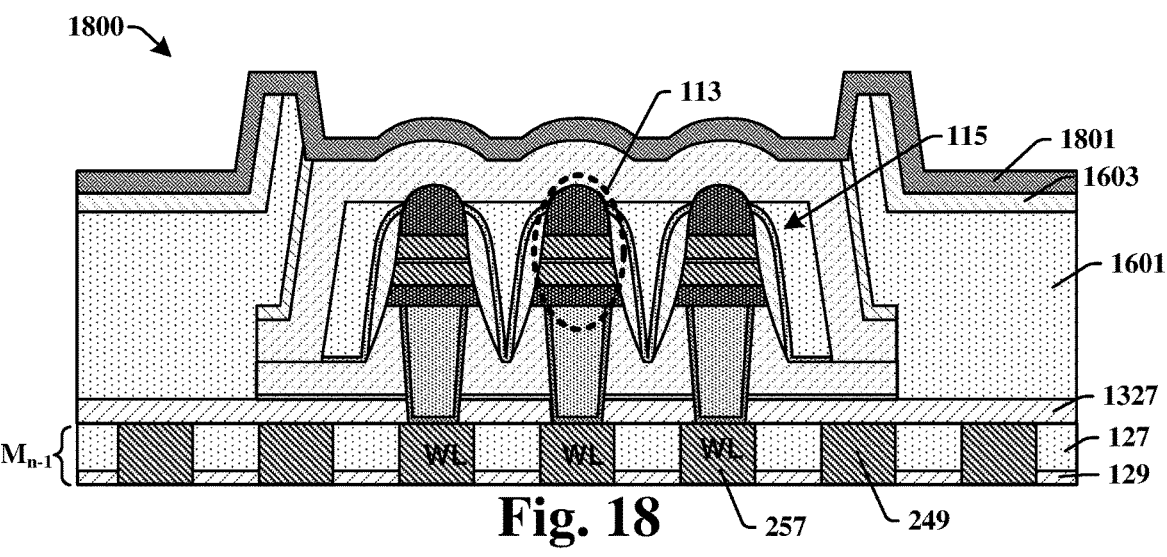

As shown by the cross-sectional view 1800 of FIG. 18, a hard mask 1801 may be formed over the structure shown by the cross-sectional view 1700 of FIG. 17. As shown by the cross-sectional view 1900 of FIG. 19, the hard mask 1801 may be patterned and used to form openings 1901 through the NFARL 1603, the ILD layer 1601, and the first etch stop layer 1327. Some additional wires 249 may be exposed through the openings 1901. The patterning and etching may proceed using a plurality of steps of a dual damascene process whereby the openings 1901 include a hole portion 1905 and a trench portion 1903.

Figure 20:
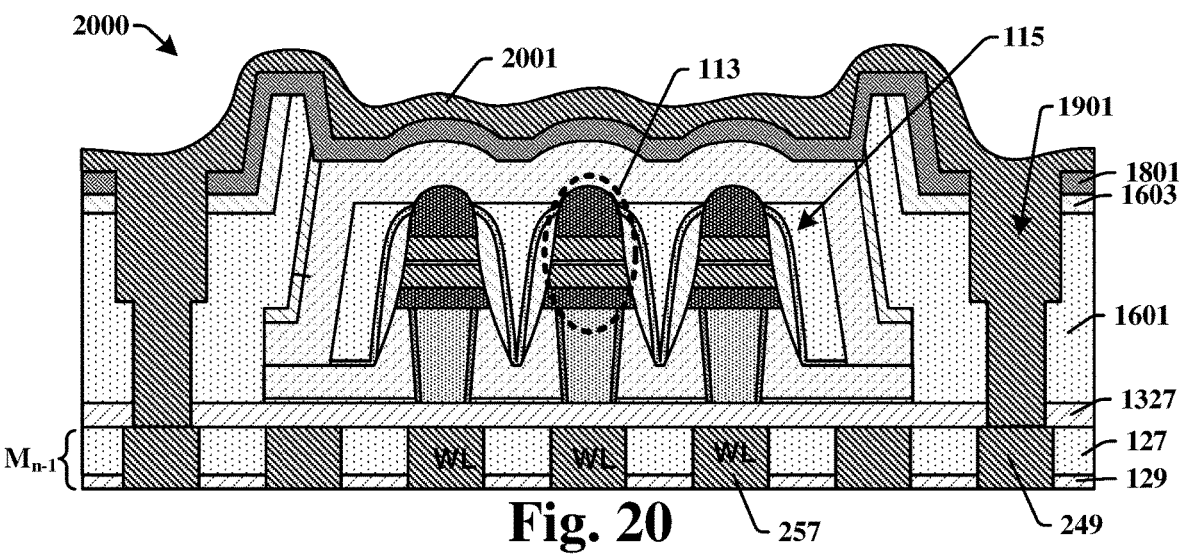

As shown by the cross-sectional view 2000 of FIG. 20, the process continues with deposition of metal 2001 to fill the openings 1901. This process may be similar to the process illustrated by the cross-sectional view 1100 of FIG. 11. In some embodiments, the metal 2001 is the magnetic shielding material. In other embodiments the metal 2001 includes materials in addition to the magnetic shielding material. In some embodiments, the metal 2001 includes multiple layers at least one of which is a metal more conductive than magnetic shielding material. In some embodiments, filling the openings 1901 includes depositing a diffusion barrier layer. The metal 2001 may be deposited by one or more processes such as PVD, CVD, ALD, plating (electrolytic or electroless), a combination thereof, or the like.

Figure 21:
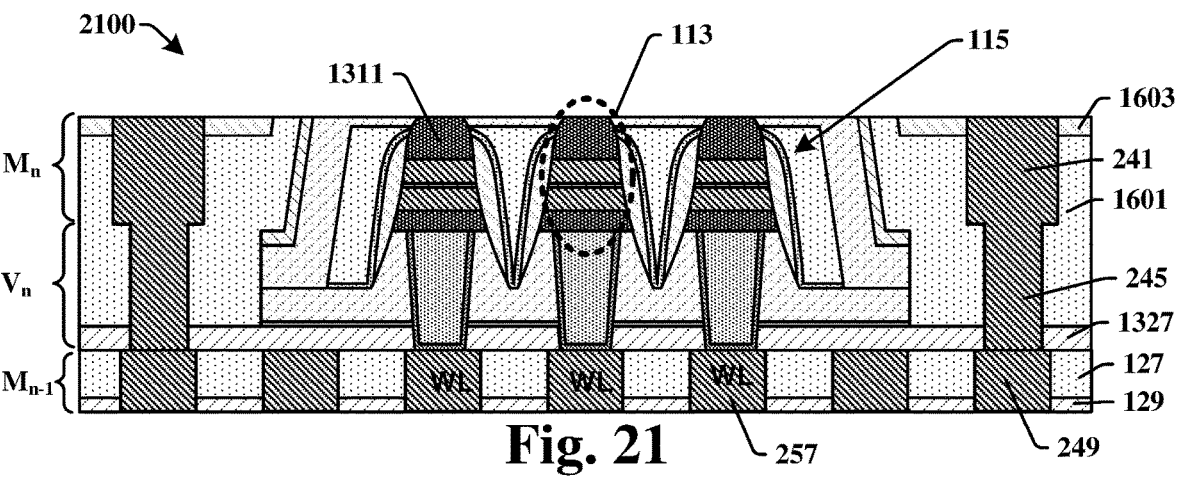

As shown by the cross-sectional view 2100 of FIG. 21, a process may be carried out to remove any of the metal 2001 that has deposited outside the openings 1901. The remaining metal 2001 forms the vias 245 of the $V_n$ via layer and the additional wires 241 of the $M_n$ metallization layer. The process may be, for example, CMP. The CMP process may also remove the hard mask 1801 and expose upper surfaces of the top electrodes 1311.

Figure 22:
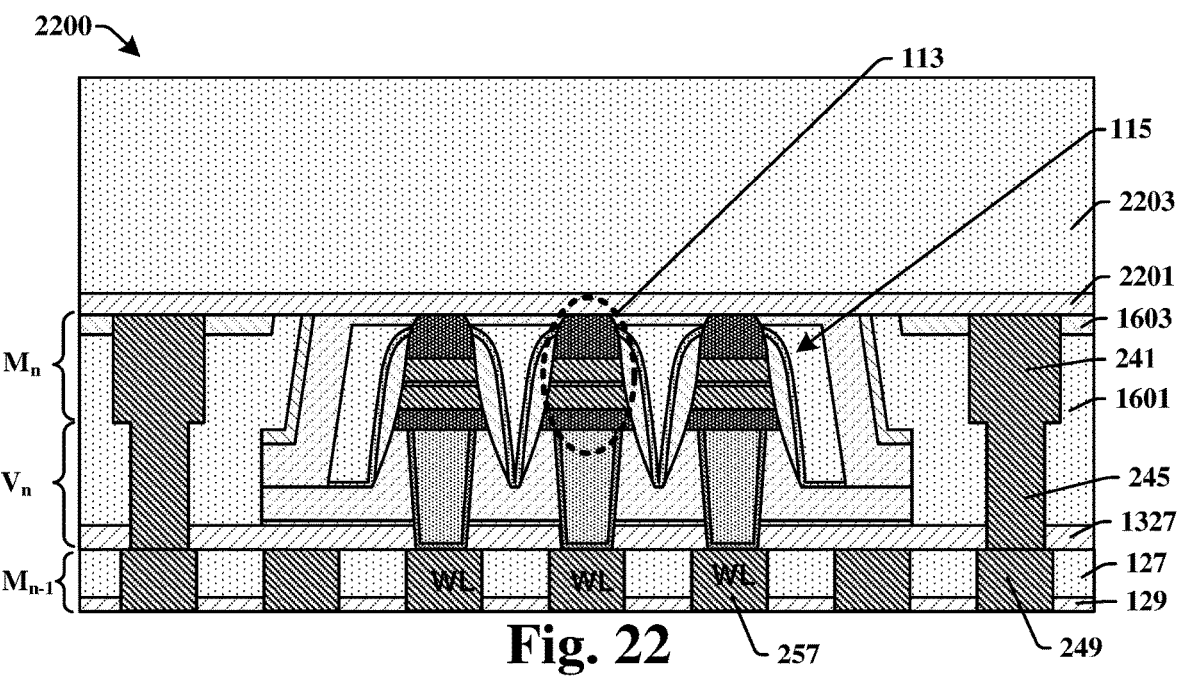
Figure 23:
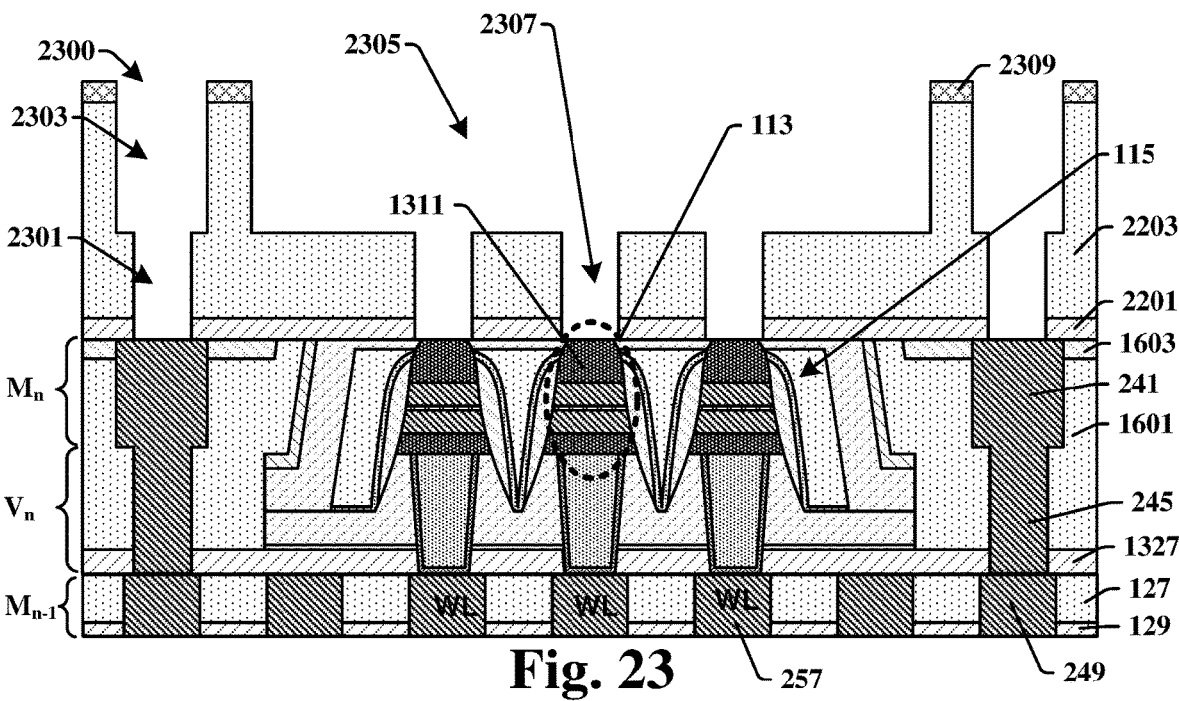

As shown by the cross-sectional view 2200 of FIG. 22, the method may continue with the formation of an etch stop layer 2201 and an ILD layer 2203 over the metallization layer $M_n$. As shown by the cross-sectional view 2300 of FIG. 23, a mask 2309 may be patterned and used to etch openings 2301, 2303, 2305, and 2307 through the interlevel dielectric layer 2203 and the etch stop layer 2201. Additional wires 241 may be exposed through the openings 2301. The top electrodes 1311 may be exposed through the openings 2307.

The patterning and etching may proceed using a plurality of steps of a dual damascene process. After etching, the mask 2309 may be stripped.

Figure 24:
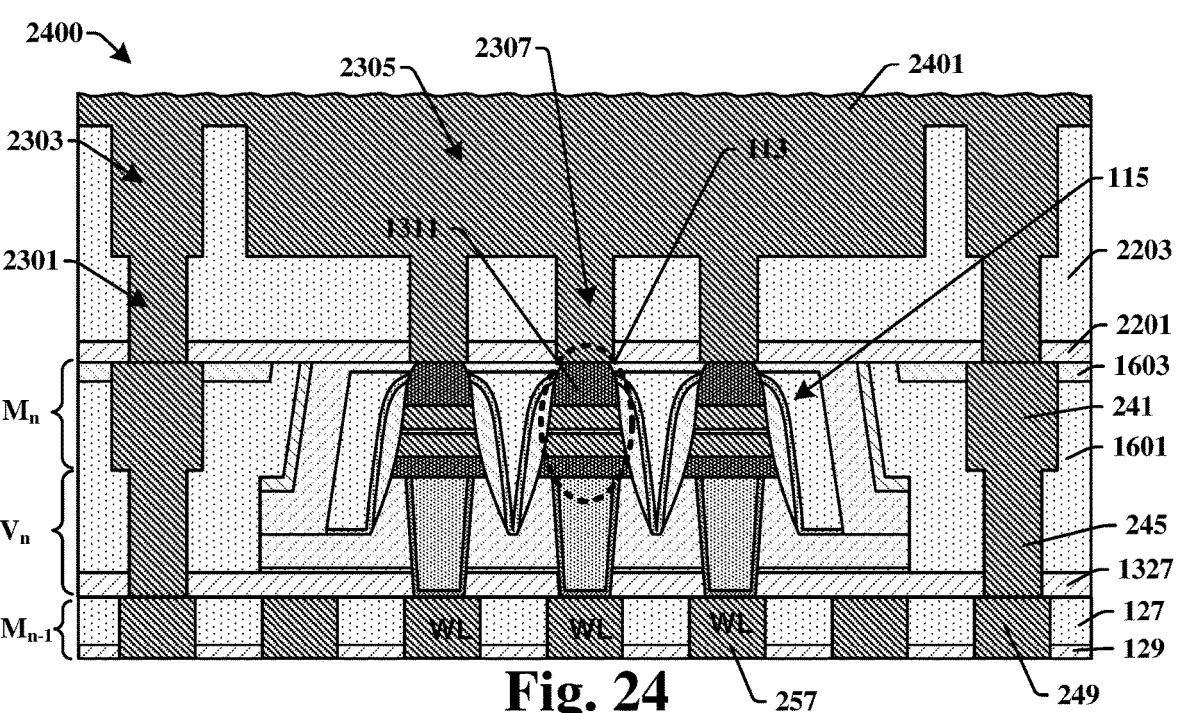

As shown by the cross-sectional view 2400 of FIG. 24, the process continues with deposition of metal 2401 to fill the openings 2301, 2303, 2305, and 2307. This process may be similar to the processes illustrated by the cross-sectional views 1100 of FIG. 11 and 2000 of FIG. 20. In some embodiments, the metal 2401 is the magnetic shielding material. In other embodiments the metal 2401 includes materials in addition to the magnetic shielding material. In some embodiments, the metal 2401 includes multiple layers at least one of which is a metal more conductive than magnetic shielding material. In some embodiments, filling the openings 2301, 2303, 2305, and 2307 includes depositing a diffusion barrier layer.

A process such as CMP may be carried out to remove any of the metal 2401 that has deposited outside the openings 2301, 2303, 2305, and 2307. The resulting structure is the one illustrated by FIG. 2A. The metal 2401 that remains after CMP forms the top electrode vias 213 and the vias 237 of the $V_{n+1}$ via layer and the bit lines 211 and the additional wires 231 of the $M_{n+1}$ metallization layer. The top electrode vias 213 connect the top electrodes 1311 to the bit lines 211.

Figure 25:
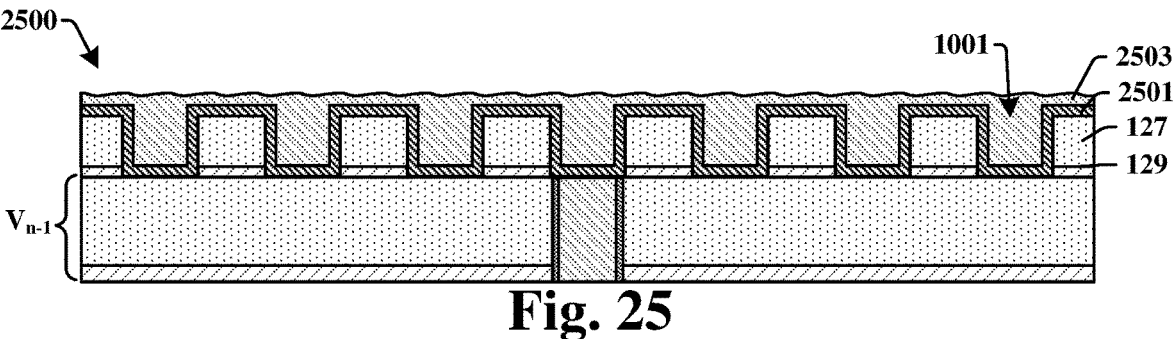
Figure 26:
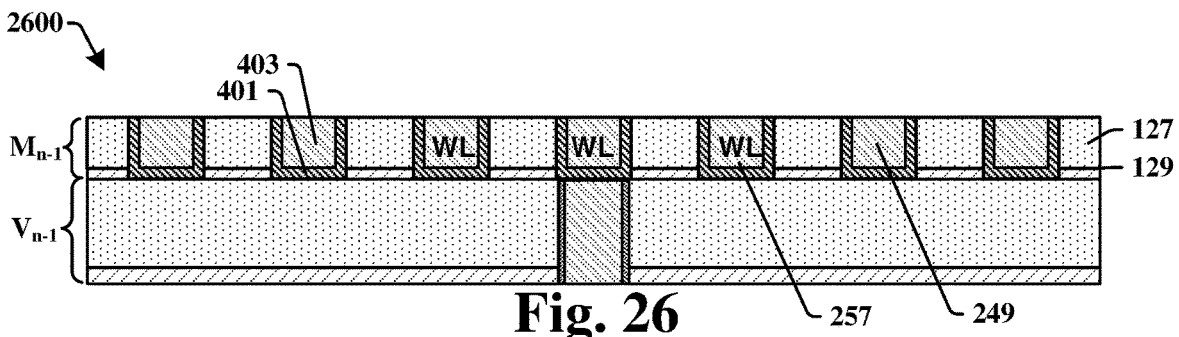

FIGS. 25 and 26 illustrate a variation of the process of FIGS. 11 and 12 which, along with similar variations of the processes of FIGS. 20 and 21 and of FIG. 24, may be used to produce embodiments like the one illustrated by the cross-sectional view 400 of FIG. 4 in which the magnetic shielding material forms a liner 401 for the metallization layers $M_{n-1}$, $M_n$, and $M_{n+1}$ and the via layers $V_n$ and $V_{n+1}$. As shown by the cross-sectional view 2500 of FIG. 25, the openings 1001 may be filled by forming in succession a first metal layer 2501 and a second metal layer 2503. The first metal layer 2501 may be the magnetic shielding material and may be formed by a conformal deposition process. A conformal deposition process may be, for example, ALD or a PVD process carried out under suitable conditions. The second metal layer 2503 may be a more conductive metal such as aluminum (Al), copper (Cu), a combination thereof, or the like. As illustrated by the cross-sectional view 2600 of FIG. 26, after CMP the metallization layer $M_{n-1}$ will include word lines 257 and additional wires 249 having a core 403 derived from the second metal layer 2503 and a liner 401 derived from first metal layer 2501. The liner 401 may provide the magnetic shielding material and be operative as a diffusion barrier layer for the core 403.

FIGS. 27-29 illustrate a variation of the process of FIGS. 11 and 12 which, along with similar variations of the processes of FIGS. 20 and 21 and of FIG. 24, may be used to produce embodiments like the one illustrated by the cross-sectional view 500 of FIG. 5 in which the metallization layers $M_{n-1}$, $M_n$, and $M_{n+1}$ comprise magnetic layers 501 and more conductive layers 503.

As shown by the cross-sectional view 2700 of FIG. 27, a first metal layer 2701 comprising the magnetic shielding material may be deposited so as to partially fill the openings 1001. The first metal layer 2701 may be deposited by one or more processes such as PVD, CVD, plating (electrolytic or electroless), a combination thereof, or the like. Optionally, deposition is followed by additional processing such as CMP and etching that causes the first metal layer 2701 to be recessed within the openings 1001.

As shown by the cross-sectional view 2800 of FIG. 28, a second metal layer 2801 comprising a more conductive metal is deposited over the first metal layer 2701. As shown by the cross-sectional view 2900 of FIG. 29, a CMP process may then be carried out to form the metallization layer $M_{n-1}$ with word lines 257 and additional wires 249 having a magnetic layer 501 derived from the first metal layer 2701 and a more conductive layer 503 derived from second metal layer 2801.

The process of FIGS. 27-29 may be further modified to provide a diffusion barrier layer, if needed. The cross-sectional view 3000 of FIG. 30 provides an example in which a diffusion barrier layer 3001 has been deposited prior to the first metal layer 2701. The diffusion barrier layer 3001 lines the word lines 257 and the additional wires 249 in their entirety and extends underneath the more conductive layer 503. The cross-sectional view 3100 of FIG. 31 provides an example in which a diffusion barrier layer 3101 has been deposited after the first metal layer 2701 but prior to the second metal layer 2801. The diffusion barrier layer 3101 lines the more conductive layer 503 and extends between the more conductive layer 503 and magnetic layer 501.

FIG. 32 presents a flow chart for a process 3200 that may be used to form an IC device according to the present disclosure. While the process 3200 of FIG. 32 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 3200 may begin with act 3201, forming a first set of metallization layers over a semiconductor substrate. This act may form that portion of the IC device 100 of FIG. 1 up to and including the first layer set 139.

Act 3203 is forming a metallization layer that includes magnetic shielding material. The cross-sectional views 900-1200 of FIGS. 9-12 provide an example. The cross-sectional views 2500-3100 of FIGS. 25-31 illustrate variations on this example that may produce wires of the type shown in the cross-sectional view 400 of FIG. 4 or of the type shown in the cross-sectional view 500 of FIG. 5. As shown by these examples, the metallization layer formed by this act provides the lower portion of the magnetic shielding structure and may include word lines.

Act 3205 is forming an MRAM cell block over the metallization layer. The cross-sectional view 1300 of FIG. 13 provides an example.

Act 3207 is removing various dielectrics from an area around the MRAM cell block.

The cross-sectional views 1400-1500 of FIGS. 14-15 provide an example. Removing these layers facilitates the formation of vias and or wires around the MRAM cell block at a height of the MRAM cell block.

Act 3209 is forming an ILD layer around the MRAM cell block. The cross-sectional views 1600-1700 of FIGS. 16-17 provide an example.

Figure 19:
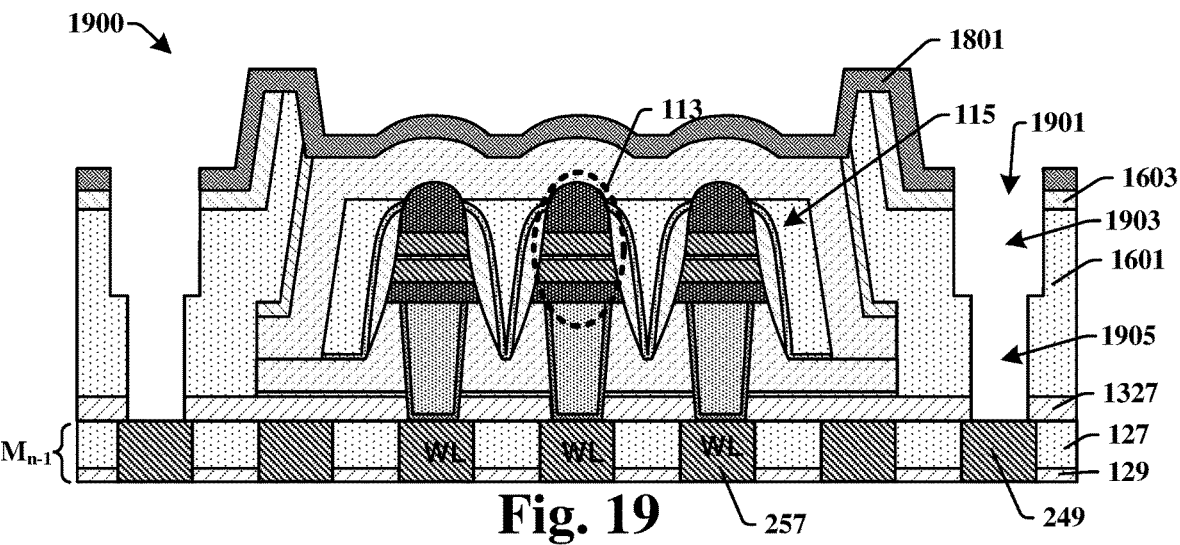

Act 3211 is forming one or more via and metallization layer around the MRAM cell block, with the via and metallization layers including a magnetic shielding material. The cross-sectional views 1900-2100 of FIGS. 19-21 provide an example. Varying this example in the manner illustrated by the cross-sectional views 2500-2600 of FIGS. 25-36 produces wires and vias of the type shown in the cross-sectional view 400 of FIG. 4. Varying this example in the manner illustrated by the cross-sectional views 2700-3100 of FIGS. 27-31 produces wires and vias of the type shown in the cross-sectional view 500 of FIG. 5. The via and metallization layers that result from this act provide the side portion of the magnetic shielding structure. At least one of these layers is at a same height above the semiconductor substrate as the MRAM cell block. Additional layers may extend above the MRAM cell block to provide, for example, a $V_{n+1}$ via layer and an $M_{n+1}$ metallization layer as illustrated in FIG. 8.

Act 3213 is forming a metallization layer that incorporates magnetic shielding material over the MRAM cell block. The cross-sectional views 2200-2400 of FIGS. 22-24 together with FIG. 2A provide an example. As shown by this example, the metallization layer formed by this act provides the upper portion of the magnetic shielding structure and may include bit lines.

Acts 3207 to 3213 form the second layer set. Act 3215 forms a third layer set over the second layer set. The third layer set provides additional via and metallization layers and completes the formation of a metal interconnect that contains an MRAM cell block and forms a magnetic shielding structure around the MRAM cell block.

Some aspects of the present disclosure relate to an IC device that includes a semiconductor substrate, a metal interconnect, a magnetoresistive random access memory (MRAM) cell block, and a magnetic shielding structure. The metal interconnect is on the semiconductor substrate. The magnetic shielding structure is around the MRAM cell block and is within the metal interconnect. In some embodiments, the metal interconnect provides the magnetic shielding structure.

Some aspects of the present disclosure relate to an IC device that includes a semiconductor substrate, a metal interconnect, and a magnetoresistive random access memory (MRAM) cell block. The metal interconnect comprises a first layer set that includes one or more metallization layers, a second layer set that includes one or more metallization or via layers, and a third layer set that includes one or more metallization layers. The third layer set is above the second layer set. The second layer set is above the first layer set. The first layer set is above the semiconductor substrate. The MRAM cell block is within the second layer set. The second layer set comprises a magnetic shielding material. The second layer set forms a magnetic shielding structure around the MRAM cell block.

Some aspects of the present disclosure relate to a method of making an IC device. The method includes forming a first set of layers that comprise one or more metallization layers over a semiconductor substrate, forming an MRAM cell block, forming a second set of layers comprising one or more metallization or via layers around the MRAM cell block, and forming a third set of layers comprising one or metallization layers over the MRAM cell block. The first set of layers, the second set of layers, and the third set of layers comprise a magnetic shielding material whereby they form a magnetic shielding structure around the MRAM cell block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an IC device, the method comprising:

forming a metal interconnect structure and a magnetoresistive random access memory (MRAM) cell block over a substrate, wherein:

the metal interconnect structure comprises metallization layers spaced apart by via layers;

each of the metallization layers comprises a distinct set of wires and is at a distinct elevation over the substrate;

each of the via layers comprises vias, and some of the vias in each of the via layers interconnect wires in vertically adjacent metallization layers;

a first portion of the metal interconnect structure comprises one or more of the metallization layers and one or more of the vias layers and is below the MRAM cell block;

the wires and the vias in the first portion of the metal interconnect structure comprise a first metal;

a second portion of the metal interconnect structure comprises at least one of the metallization layers and one of the vias layers;

the wires and the vias in the second portion of the metal interconnect structure comprise a second metal and a third metal, wherein the third metal is absent from the first portion of the metal interconnect structure, and the second metal has a higher electrical conductivity than the third metal;

the third metal in the second portion of the metal interconnect structure provides a magnetic shielding structure around the MRAM cell block;

a third portion of the metal interconnect structure comprises one or more of the metallization layers and one or more of the vias layer and is above the MRAM cell block; and the wires and the vias in the third portion of the metal interconnect structure comprise the first metal, but not the third metal;

wherein forming the second portion of the metal interconnect structure comprises:

etching an opening in a dielectric, wherein the opening comprises a hole portion and a trench portion, the hole portion extends downward from the trench portion; and forming a layer of the third metal followed by a layer of the second metal in the opening, wherein the third metal completely fills the hole portion.

2. The method of claim 1, wherein the magnetic shielding structure comprises a row of vias encircling the MRAM cell block.

3. The method of claim 1, wherein one of the wires or one of the vias in the magnetic shielding structure is floating.

4. The method of claim 1, wherein the magnetic shielding structure provides a magnetic shielding efficiency of 1.5 or greater for the MRAM cell block.

5. The method of claim 1, wherein the third metal has a magnetic permeability greater than or equal to that of cobalt, and the first and second metals have magnetic permeabilities less than or equal to those of aluminum and copper.

6. The method of claim 1, wherein the first portion of the metal interconnect structure comprises at least four of the metallization layers.

7. The method of claim 1, wherein the metallization layers and the via layers are formed by dual damascene processes.

8. The method of claim 1, wherein the second metal is the first metal.

9. The method of claim 1, wherein at least one of the metallization layers in the second portion of the metal interconnect structure is above the MRAM cell block and at least one of the metallization layers in the second portion of the metal interconnect structure is below the MRAM cell block.

10. The method of claim 9, wherein at least two of the metallization layers in the second portion of the metal interconnect structure are above the MRAM cell block.

11. A method of making an IC device, the method comprising:

forming a first metallization layer over a substrate, wherein the first metallization layer comprises first wires;

forming a magnetoresistive random access memory (MRAM) cell block over the first metallization layer; and using one or more damascene or dual damascene processes, forming a magnetic shielding structure around the MRAM cell block;

wherein each damascene or dual damascene process comprises forming a dielectric layer, etching an opening in the dielectric layer, depositing two metal layers in the opening including a first metal layer and a second metal layer, and chemical mechanical polishing to remove excess metal;

at least one of the damascene or dual damascene processes is a dual damascene process in which the opening comprises a hole portion and a trench portion, the hole portion extends downward from the trench portion, the first metal layer is deposited before the second metal layer, and the first metal layer completely fills the hole portion;

the first metal layer comprises a magnetic shielding material and provides the magnetic shielding structure;

the magnetic shielding structure provides a magnetic shield efficiency of 1.5 or greater for the MRAM cell block; and the second metal layer has a higher electrical conductivity than the first metal layer.

12. The method of claim 11, wherein forming the magnetic shielding structure around the MRAM cell block comprises at least three dual damascene processes.

13. The method of claim 12, wherein at least two of the dual damascene processes form metallization layers above the MRAM cell block.

14. The method of claim 12, wherein at least one of the damascene processes forms a metallization layer below the MRAM cell block.

15. The method of claim 11, wherein the second metal layer comprises copper.

16. A method of making an IC device, the method comprising:

forming a metal interconnect structure and a plurality of magnetoresistive random access memory (MRAM) cell blocks over a substrate, wherein:

the metal interconnect structure comprises metallization layers spaced apart by via layers;

each of the metallization layers comprises a distinct set of wires and is at a distinct elevation over the substrate;

each of the via layers comprises vias, and some of the vias in each of the via layers interconnect wires in vertically adjacent metallization layers;

a first portion of the metal interconnect structure comprises one or more of the metallization layers and one or more of the via layers and is below the plurality of MRAM cell blocks;

the wires and the vias in the first portion of the metal interconnect structure have a first composition;

a second portion of the metal interconnect structure comprises at least one of the metallization layers and one of the via layers;

the wires and the vias in the second portion of the metal interconnect structure have a second composition, which is distinct from the first composition;

the second portion of the metal interconnect structure provides magnetic shielding structures around each of the MRAM cell blocks and the second portion of the metal interconnect structure comprises at least two of the metallization layers, wherein the at least two of the metallization layers are above the plurality of MRAM cell blocks;

a third portion of the metal interconnect structure comprises one or more of the metallization layers and one or more of the via layers and is above the plurality of MRAM cell blocks; and the wires and the vias in the third portion of the metal interconnect structure have the first composition.

17. The method of claim 16, wherein the magnetic shielding structures comprise wires or vias that are inoperative as electrical connections within the metal interconnect structure.

18. The method of claim 16, wherein the magnetic shielding structures comprise portions above, below, and around each of the plurality of MRAM cell blocks, and one of the metallization layers is between the plurality of MRAM cell blocks and the portions of the magnetic shielding structures above the plurality of MRAM cell blocks.

19. The method of claim 16, wherein each of the magnetic shielding structures provides a magnetic shielding efficiency of 2.0 or greater for a respective one of the MRAM cell blocks.

20. The method of claim 16, wherein forming the second portion of the metal interconnect structure comprises:

forming a dielectric layer;

etching an opening in the dielectric layer, wherein the opening comprises a hole portion and a trench portion, and the hole portion extends downward from the trench portion;

depositing a first metal layer in the opening;

depositing a second metal layer in the opening;

chemical mechanical polishing to remove excess metal;

wherein the first metal layer completely fills the hole portion;

the first metal layer provides the magnetic shielding structures; and the second metal layer has a distinct composition from the first metal layer and provides a higher electrical conductivity than the first metal layer.

* * * * *